United States Patent
Hwang

(10) Patent No.: US 11,092,554 B2
(45) Date of Patent: Aug. 17, 2021

(54) ADHESION DEFECT DETECTION APPARATUS AND ADHESION DEFECT DETECTION METHOD USING THE SAME

(71) Applicant: SAMSUNG DISPLAY CO., LTD., Yongin-si (KR)

(72) Inventor: Tae Jin Hwang, Gwacheon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 63 days.

(21) Appl. No.: 16/711,028

(22) Filed: Dec. 11, 2019

(65) Prior Publication Data
US 2020/0240923 A1 Jul. 30, 2020

(30) Foreign Application Priority Data

Jan. 30, 2019 (KR) .................. 10-2019-0011877

(51) Int. Cl.
*G01N 21/00* (2006.01)
*G01N 21/86* (2006.01)
*G02F 1/1333* (2006.01)
*H01L 51/00* (2006.01)

(52) U.S. Cl.
CPC ....... *G01N 21/86* (2013.01); *G02F 1/133305* (2013.01); *H01L 51/0097* (2013.01); *G01N 2021/869* (2013.01)

(58) Field of Classification Search
CPC .... G01N 21/00; G01N 21/86; G01N 21/6456; G01N 21/8851; G01N 21/88; G01N 21/896; G02F 1/133305; H01L 51/0097; G06T 7/0008; G06K 9/4604; G06K 9/4661; G06K 9/6215

USPC ........ 356/237.1–237.5, 239.1, 239.2, 239.7, 356/239.8; 73/600, 627
See application file for complete search history.

(56) References Cited

U.S. PATENT DOCUMENTS

| | | | | |
|---|---|---|---|---|
| 6,069,693 A | * | 5/2000 | Licchesi | G01N 21/88 356/237.1 |
| 10,600,173 B2 | * | 3/2020 | Park | G06T 7/0004 |
| 10,769,775 B2 | * | 9/2020 | Chu | G01N 21/6456 |
| 2004/0103721 A1 | * | 6/2004 | Georgeson | G01N 29/28 73/599 |
| 2013/0291486 A1 | * | 11/2013 | Shinomori | B65B 57/10 53/396 |
| 2018/0183415 A1 | | 6/2018 | Hwang et al. | |

FOREIGN PATENT DOCUMENTS

KR 101782889 9/2017

* cited by examiner

*Primary Examiner* — Hoa Q Pham
(74) *Attorney, Agent, or Firm* — F. Chau & Associates, LLC

(57) ABSTRACT

An adhesion defect detection apparatus includes an inspection window having a first dummy area, a second dummy area, and an inspection area disposed between the first dummy area and the second dummy area. A first shape changer is disposed on the inspection window. The first shape changer is configured to change a shape of the inspection window in a first direction. A second shape changer is disposed outside of both the first dummy area and the second dummy area. The second shape changer is configured to change a shape of the inspection window in a second direction that is perpendicular to the first direction.

29 Claims, 46 Drawing Sheets

FIG. 2
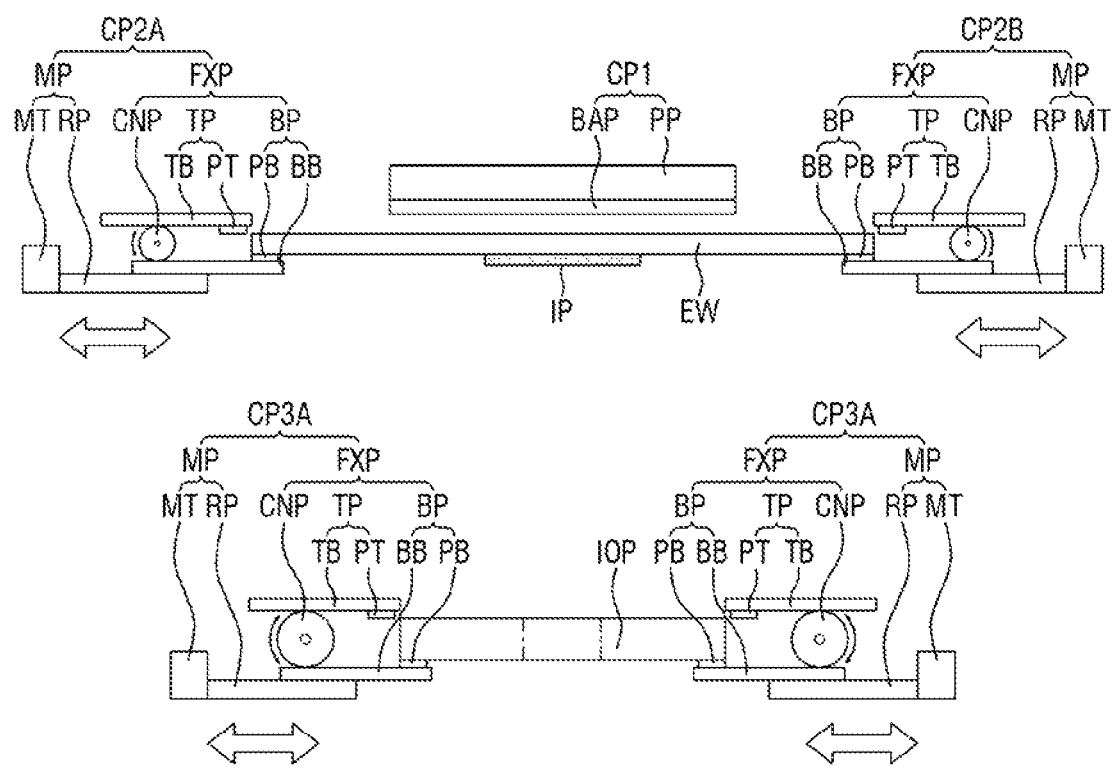
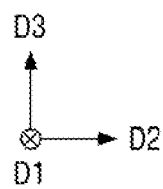

FIG. 15
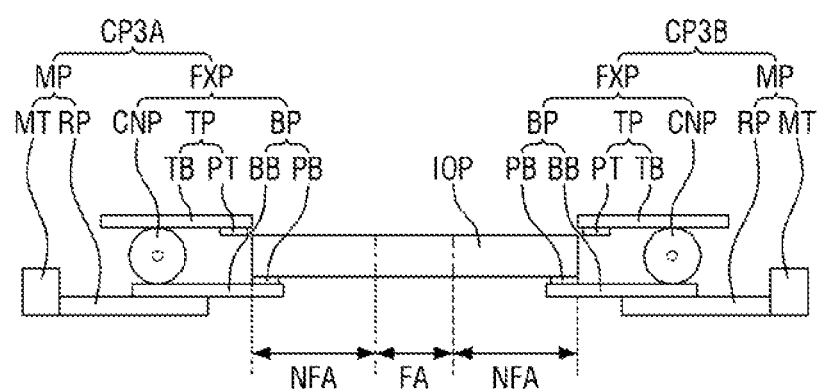
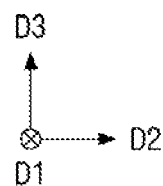

FIG. 16
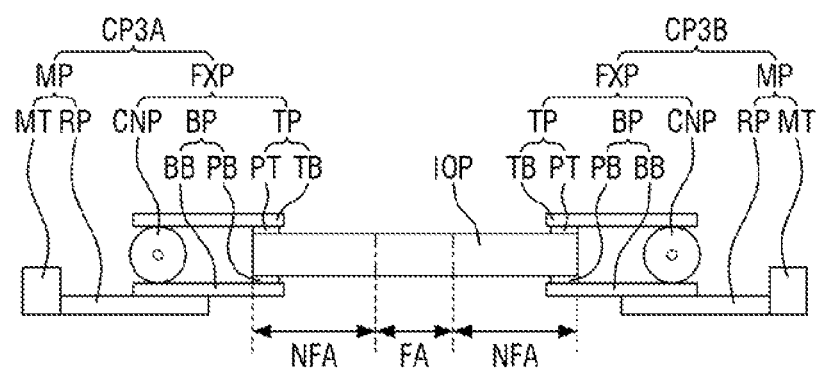
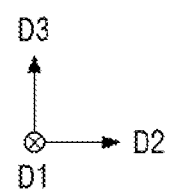

FIG. 29
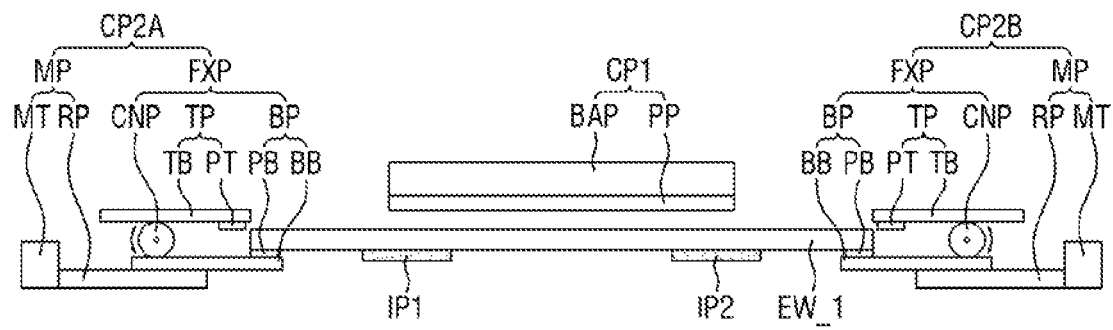
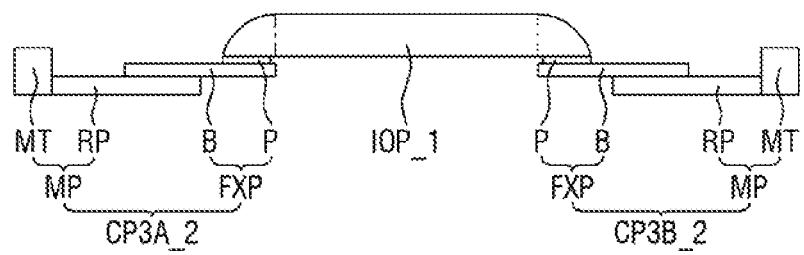
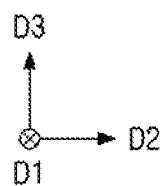

FIG. 30
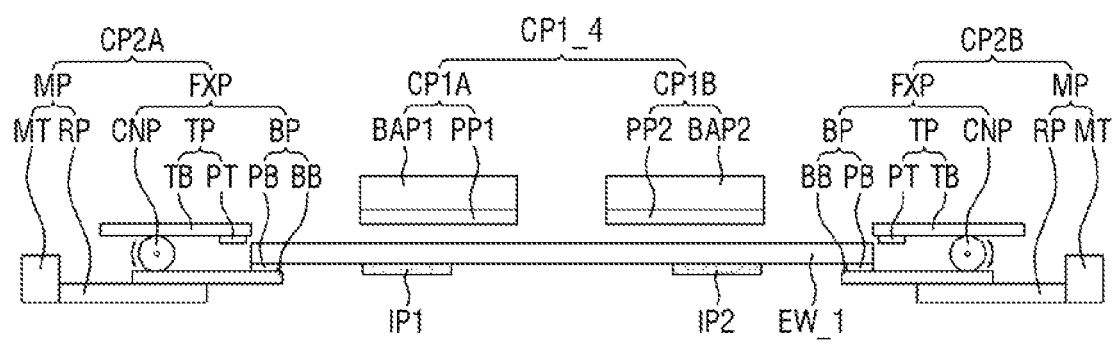
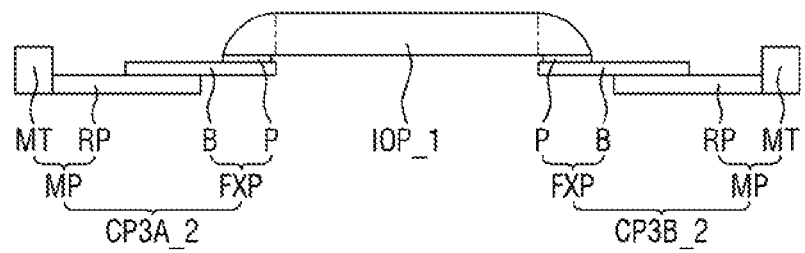
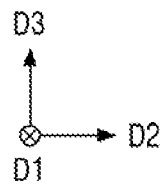

FIG. 34
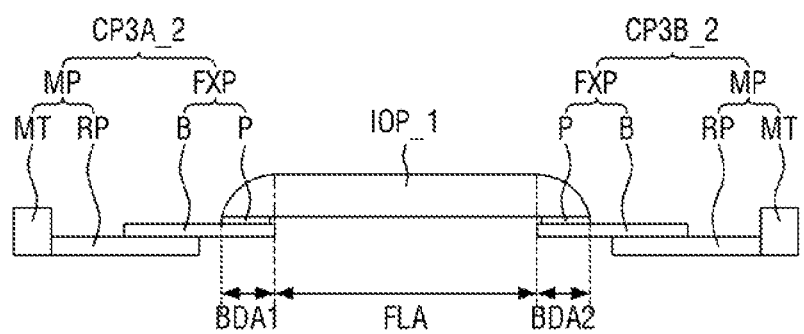
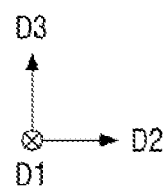

FIG. 35
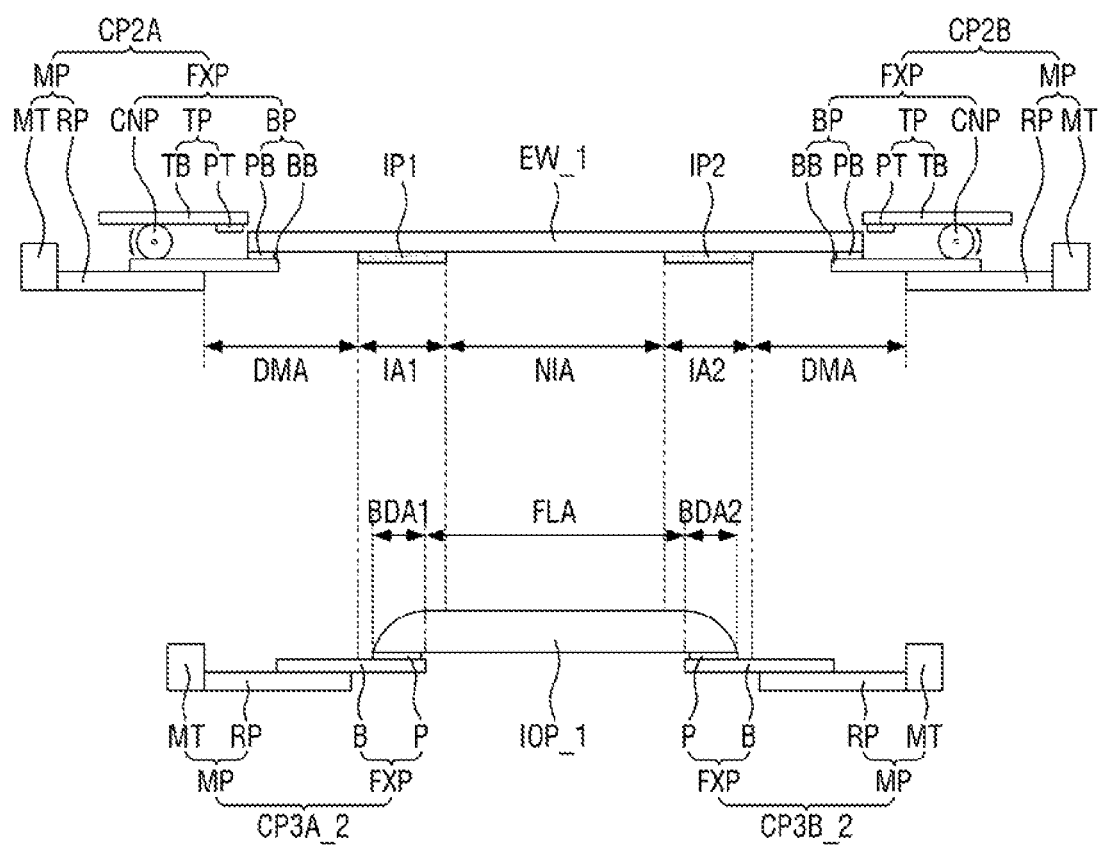
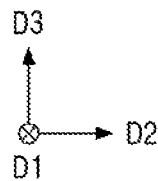

ADHESION DEFECT DETECTION APPARATUS AND ADHESION DEFECT DETECTION METHOD USING THE SAME

This application claims priority to and the benefit of Korean Patent Application No. 10-2019-0011877, filed on Jan. 30, 2019, in the Korean Intellectual Property Office, the disclosure of which is herein incorporated by reference in its entirety.

TECHNICAL FIELD

The present disclosure relates to adhesion defect detection and, more specifically, to an adhesion defect detection apparatus and an adhesion defect detection method using the same.

DISCUSSION OF THE RELATED ART

Flat panel display devices, such as those that utilize liquid crystal display (LCD) technology or organic light emitting diode (OLED) display technology, are being designed to be bendable. While most bendable display devices are configured to be bent once and then permanently set in a desired bent configuration, some emerging bendable display devices are configured to be repeatedly bent and unbent. Bendable display devices such as these have been incorporated into foldable or rollable devices, which may provide both a large display area when fully opened as well as a smaller and more portable shape when folded or rolled.

A flexible display device, such as described above, may include display elements formed on a flexible substrate. The flexible substrate may be made of plastic while the display elements may be organic light emitting elements and/or liquid crystal elements.

As display elements such as those listed above may tend to include thin-film transistors, fabrication of flexible display devices may include a number of thin-film processes. The flexible substrate, after having gone through these thin-film processes, is sealed by an encapsulation layer. The flexible substrate, the thin-film transistors formed on the flexible substrate, and the encapsulation layer may together contribute to a display panel of a flexible display device.

Generally, when incorporated into an electronic device, a cover window is attached to a front surface of a display panel to protect the display panel as the electronic device is used. Here, a bonding agent is interposed between the display panel and the cover window to bond the cover window to the display panel.

In the case of flexible display devices that have been configured to be foldable or bendable, defects frequently occur when a display panel and a cover window are bonded together. As it may be difficult to repair such a defect, both the display panel and the cover window are discarded.

SUMMARY

Aspects of the present disclosure provide an adhesion defect detection apparatus capable of detecting defects that occur when a cover window and a panel are bonded together. According to this approach, bonding defects may be detected prior to bonding.

Aspects of the present disclosure also provide an adhesion defect detection method employed to detect defects that occur when a cover window and a panel are bonded together. According to this approach, bonding defects may be detected prior to bonding.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided an adhesion of a cover window to a panel and an apparatus for detecting defects that may be formed in relation to this adhesion. The adhesion defect detection apparatus includes an inspection window which has a first dummy area, a second dummy area, and an inspection area disposed between the first dummy area and the second dummy area. A first shape changing member is disposed on the inspection window and changes the shape of the inspection window in a first direction. A second shape changing member is disposed outside the first dummy area and the second dummy area and changes the shape of the inspection window in a second direction perpendicular to the first direction.

According to another aspect of the present disclosure, a method for adhesion defect detection is provided. The adhesion defect detection method includes stretching an inspection window and an inspection target panel. A first shape changing member is placed on the inspection window and the shape of the inspection window is changed in a first direction using the first shape changing member. The inspection window is brought close to the inspection target panel to detect adhesion defects.

BRIEF DESCRIPTION OF THE DRAWINGS

A more complete appreciation of the present disclosure and many of the attendant aspects thereof will become apparent and more readily appreciated from the following description, taken in conjunction with the accompanying drawings, in which:

FIG. 2 is a schematic cross-sectional view illustrating an adhesion defect detection apparatus according to an exemplary embodiment of the present disclosure;

FIG. 15 is a schematic cross-sectional view illustrating an operation of placing an inspection target panel on a third shape changer in the adhesion defect detection method using the adhesion defect detection apparatus according to an exemplary embodiment of the present disclosure;

FIG. 16 is a schematic cross-sectional view illustrating an operation of fixing the inspection target panel using the third shape changer in the adhesion defect detection method using the adhesion defect detection apparatus according to an exemplary embodiment of the present disclosure;

FIG. 29 is a schematic cross-sectional view illustrating the adhesion defect detection apparatus according to an exemplary embodiment of the present disclosure of FIG. 28;

FIG. 30 is a schematic cross-sectional view illustrating an adhesion defect detection apparatus according to an exemplary embodiment of the present disclosure;

FIG. 34 is a schematic cross-sectional view illustrating an operation of placing and fixing an inspection target panel on a third shape changer in the adhesion defect detection method using the adhesion defect detection apparatus according to an exemplary embodiment of the present disclosure;

FIG. 35 is a schematic cross-sectional view illustrating an operation of aligning the inspection window and the inspection target panel in the adhesion defect detection method using the adhesion defect detection apparatus according to an exemplary embodiment of the present disclosure;

DETAILED DESCRIPTION

Figure 1:
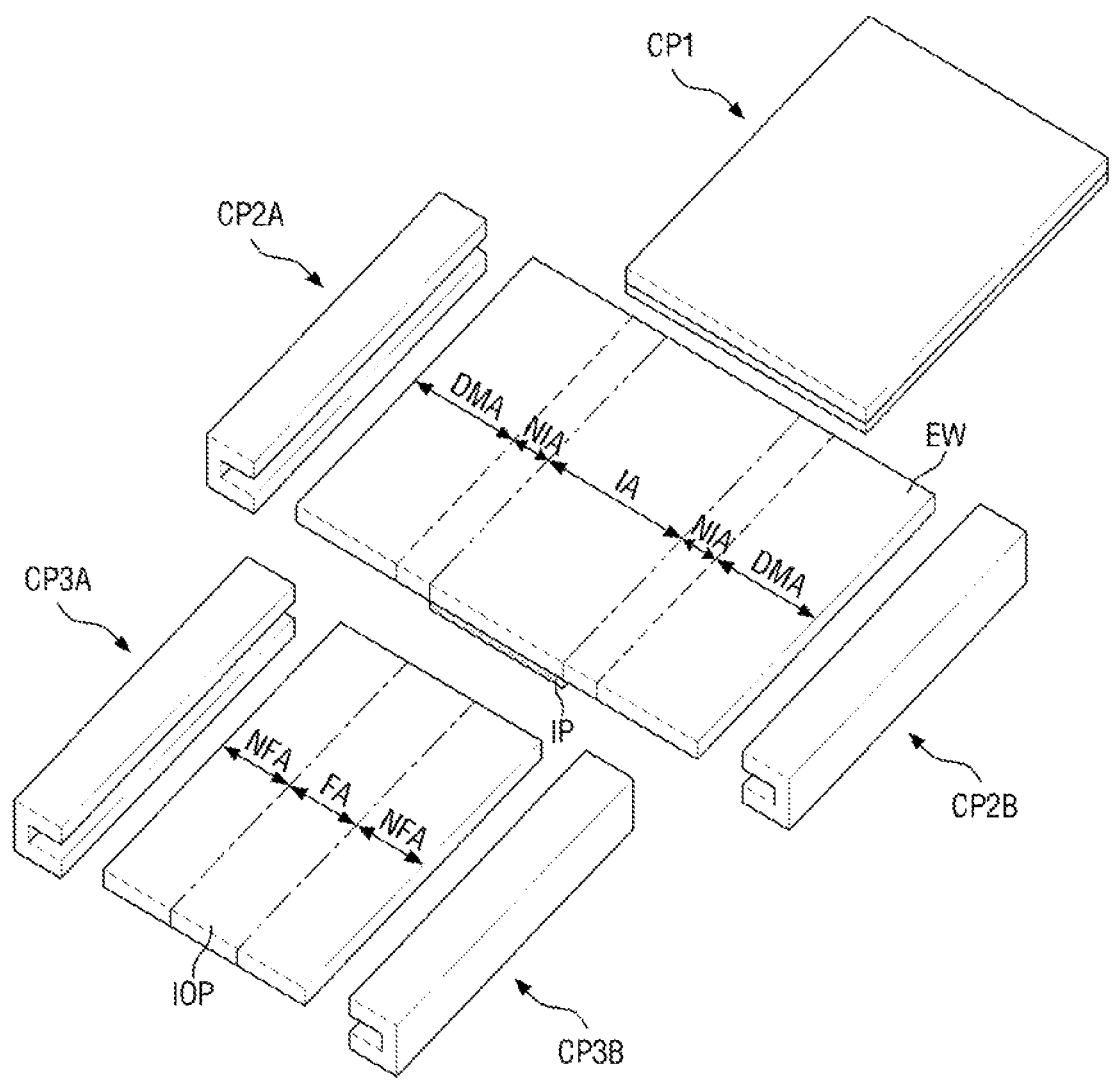
FIG. 1 is a schematic perspective view illustrating an adhesion defect detection apparatus according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Unless otherwise specified, the illustrated exemplary embodiments of the present disclosure are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals may denote like elements throughout the specification and the drawings.

When an element, such as a layer, is referred to as being "on," "connected to," or "coupled to" another element or layer, it may be directly on, connected to, or coupled to the other element or layer or intervening elements or layers may be present. To this end, the term "connected" may refer to physical, electrical, and/or fluid connection, with or without intervening elements. Further, the D1-axis, the D2-axis, and the D3-axis are not limited to three Cartesian coordinates, such as the x, y, and z-axes, and may be interpreted in a broader sense. For example, the D1-axis, the D2-axis, and the D3-axis may be perpendicular to one another, or may represent different directions that are not perpendicular to one another.

The terms "first," "second," etc. may be used herein to describe various types of elements, these terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions might not reflect actual shapes of regions of a device and, as such, are not necessarily intended to be limiting. However, it is to be understood that the relative shapes, patterns, and angles are indeed intended to represent at least one exemplary approach and so these relative shapes, patterns, and angles shown may be treated as limitations to at least one particular exemplary embodiment of the present disclosure.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

It will be apparent to those skilled in the art that various modifications and variations can be made to the disclosed embodiments without departing from the spirit and scope of the inventive concepts.

Throughout the specification and figures, the same reference numerals may be used to represent the same or similar elements.

Hereinafter, exemplary embodiments of the present disclosure will be described with reference to the attached drawings.

FIG. 1 is a schematic perspective view illustrating an adhesion defect detection apparatus 10 according to an exemplary embodiment of the present disclosure. FIG. 2 is a schematic cross-sectional view illustrating the adhesion defect detection apparatus 10 according to an exemplary embodiment of the present disclosure.

Referring to FIGS. 1 and 2, in some embodiments, the adhesion defect detection apparatus 10 may include an inspection window EW, a first shape changer CP1, a second shape changer CP2, and a third shape changer CP3. The shape changers CP1 to CP3 may be embodied as pushing elements that are configured to push upon a flexible substrate so as to change its shape, e.g. bent it.

In some embodiments, the inspection window EW may be rectangular in plan view. The inspection window EW may include a pair of short sides extending in a first direction D1 and a pair of long sides extending in a second direction D2 intersecting the first direction D1. Each corner where the long and short sides of the inspection window EW meet may be right-angled, but may also be curved (e.g. to form rounded corners).

Unless otherwise defined, the terms "on," "above," "upper," "top," and "upper surface" used herein denote a direction in which an arrow indicating a third direction D3 that intersects the first direction D1 and the second direction D2 points in the drawings, and the terms "under," "below," "lower," "bottom," and "lower surface" used herein denote a direction opposite to the direction in which the arrow indicating the third direction D3 points in the drawings.

In some embodiments, the inspection window EW may include an inspection area IA, one or more non-inspection areas NIA, and one or more dummy areas DMA. The inspection area IA is an area for detecting defects that may occur in an inspection target panel IOP during bonding, the non-inspection area NIA is an area which at least partially overlaps the inspection target panel IOP in the third direction D3 together with the inspection area IA, and the dummy area DMA is an area of the inspection window EW which does not overlap the inspection target panel IOP in the third direction D3 and to which the second shape changer CP2 is coupled. The inspection area IA, the non-inspection area NIA and the dummy area DMA of the inspection window EW can be changed variously according to the shape of the inspection target panel IOP and the area to be inspected.

The inspection window EW may be made of transparent glass or plastic. For example, the inspection window EW may be made of a light transmitting material. In some embodiments, the inspection window EW may have flexible properties. For example, the inspection window EW may be made of a bendable, foldable or rollable material or structure and thus may be bendable, foldable or rollable, without cracking or breaking. In addition, the inspection window EW may be made of the same material as a cover window coupled to the inspection target panel IOP.

The inspection target panel IOP to be inspected for the presence of adhesion defects may be located under the inspection window EW of the adhesion defect detection apparatus 10.

The inspection target panel IOP may be a display panel or a touch screen panel (TSP) used in a display device. In some embodiments, the inspection target panel IOP may be a touch-sensing unit.

In some embodiments, the inspection target panel IOP may be a foldable display panel. For example, the inspection target panel IOP may include a first non-folding area NFA, a folding area FA, and a second non-folding area NFA arranged sequentially in the second direction D2, and the inspection target panel IOP may be folded, in the folding area FA, upward or downward with respect to the non-folding area NFA.

The inspection window EW may have a larger area than the inspection target panel IOP. However, the present invention is not limited to this case. In some embodiments, the inspection window EW and the inspection target panel IOP may have the same area, or the inspection target panel IOP may have a larger area than the inspection window EW.

The inspection area IA of the inspection window EW may at least partially overlap the folding area FA of the inspection target panel IOP in the third direction D3. In some embodiments, a width of the inspection area IA of the inspection window EW in the second direction D2 may be greater than a width of the folding area FA of the inspection target panel IOP in the second direction D2. In this case, the inspection area IA of the inspection window EW may at least partially overlap a portion of the non-folding area NIA of the inspection target panel IOP in the third direction D3. In some embodiments, the width of the inspection area IA of the inspection window EW in the second direction D2 may be equal to the width of the folding area FA of the inspection target panel IOP in the second direction D2.

In some embodiments, a length of the inspection area IA of the inspection window EW in the first direction D1 may be greater than a length of the folding area FA of the inspection target panel IOP in the first direction D1. In some embodiments, the length of the inspection area IA of the inspection window EW in the first direction D1 may be equal to the length of the folding area FA of the inspection target panel IOP in the first direction D1. For example, the inspection area IA of the inspection window EW may substantially correspond to, and align with, the folding area FA of the target panel IOP in the D1 and D2 directions.

The non-inspection area NIA of the inspection window EW may at least partially overlap the non-folding area NFA of the inspection target panel IOP in the third direction D3. In some embodiments, a width of the non-inspection area NIA of the inspection window EW in the second direction D2 may be smaller than a width of the non-folding area NFA of the inspection target panel IOP in the second direction D2. In some embodiments, the width of the non-inspection area NIA of the inspection window EW may be equal to the width of the non-folding area NFA of the inspection target panel IOP in the second direction D2.

The dummy area DMA of the inspection window EW might not overlap the inspection target panel IOP in the third direction D3. However, the present invention is not limited to this case. In some embodiments, the dummy area DMA of the inspection window EW may partially overlap the inspection target panel IOP in the third direction D3.

An inspection adhesive IP may be disposed on a lower surface of the inspection window EW. In some embodiments, the inspection adhesive IP may at least partially overlap the inspection area IA of the inspection window EW in the third direction D3. In addition, the inspection adhesive IP may have the same area as the inspection area IA of the inspection window EW. However, the present invention is not limited to this case. In some embodiments, the inspection adhesive IP may have a smaller area than the inspection area IA of the inspection window EW. In some embodiments, the inspection adhesive IP may at least partially overlap the inspection area IA of the inspection window EW and the non-inspection area NIA of the inspection window EW. In addition, in some embodiments, the inspection adhesive IP may at least partially overlap the inspection area IA of the inspection window EW, the non-inspection area NIA of the inspection window EW, and a portion of the dummy area DMA in the third direction D3.

In some embodiments, the inspection adhesive IP may be formed of an optically clear adhesive (OCA). Alternatively, various adhesives used to bond a display panel and a cover window can be used. However, the inspection adhesive P may be made of an adhesive actually used to bond the inspection target panel IOP to the cover window to increase the accuracy of adhesion defect detection.

The inspection adhesive IP may be disposed between the inspection window EW and the inspection target panel IOP and may be located on the folding area FA and the non-folding area NFA of the inspection target panel IOP. However, the present invention is not limited to this case, and the inspection adhesive IP may also be located only on the folding area FA of the inspection target panel IOP.

The first shape changer CP1 may be disposed on the inspection window EW. The first shape changer CP1 may include a base BAP and a pattern PP located between the base BAP and the inspection window EW. The first shape changer CP1 may change the shape of the inspection window EW in the third direction D3 or a direction opposite to the third direction D3.

In some embodiments, the first shape changer CP1 may have a smaller width than the inspection window EW in the second direction D2. In addition, the first shape changer CP1 may have a greater width than the inspection area IA of the inspection window EW in the second direction D2. In some embodiments, the first shape changer CP1 may have the same width as the inspection window EW in the second direction D2.

The second shape changer CP2 may be disposed parallel to the inspection window EW in the second direction D2. The second shape changer CP2 may change the shape of the inspection window EW in the second direction D2 and a direction opposite to the second direction D2.

The second shape changer CP2 may include a first attachment group CP2A and a second attachment group CP2B. The first attachment group CP2A and the second attachment group CP2B may face each other with the inspection window EW interposed between them in the second direction D2. However, the present invention is not limited to this case. In some embodiments, the first attachment group CP2A and the second attachment group CP2B may face each other with the inspection window EW interposed between them in the first direction D1. In this case, the second shape changer CP2 may change the shape of the inspection window EW in the first direction D1 and a direction opposite to the first direction D1. In addition, in some embodiments, the second shape changer CP2 may include a plurality of attachment groups facing each other with the inspection window EW interposed between them in the first direction D1 and the second direction D2. In this case, the second shape changer CP2 may change the shape of the inspection window EW in the first direction D1, the second direction D2, the direction opposite to the first direction D1 and the direction opposite to the second direction D2.

Each of the first attachment group CP2A and the second attachment group CP2B may include a fixer FXP which fixes the dummy area DMA of the inspection window EW and a actuator MP which moves the fixer FXP in the second direction D2 and the direction opposite to the second direction D2.

The fixer FXP may include an upper portion TP, a lower portion BP facing the upper portion TP, and a connector CNP connecting the upper portion TP and the lower portion BP. The upper portion TP and the lower portion BP may be connected by the connector CNP and moved by the connector CNP in the second direction D2 and the direction opposite to the second direction D2, respectively. In addition, the upper portion TP and the lower portion BP may contact the dummy area DMA of the inspection window EW to fix the inspection window EW in place. However, the present invention is not limited to this case. In some embodiments, the fixer FXP may be composed of only the lower portion BP and the upper portion TP may be omitted.

The upper portion TP may include an upper base TB and an upper pad PT disposed on a lower surface of the upper base TB. The upper pad PT may be made of a porous vacuum pad and may suction or release an upper surface of the inspection window EW according to the flow of air sucked into or expelled from the upper base TB.

The lower portion BP may include a lower base BB and a lower pad PB disposed on a lower surface of the lower base BB. The lower pad PB may be made of a porous vacuum pad and may suction or release the lower surface of the inspection window EW according to the flow of air sucked into or expelled from the lower base BB.

In some embodiments, the upper pad PT and the lower pad PB may be made of an adhesive material. In this case, the fixer FXP may fix the inspection window EW using the adhesive properties of the upper pad PT and the lower pad PB. In addition, in some embodiments, one of the upper pad PT and the lower pad PB may be made of a porous vacuum pad, and the other one may be made of an adhesive material.

The actuator MP may include a movement guide RP and a motor MT.

The movement guide RP may be fixed to a lower surface of the fixer FXP and may be moved by the motor MT in the second direction D2 and the direction opposite to the second direction D2. The motor MT is fixed to a side surface of the movement guide RP and moves the movement guide RP in the second direction D2 and the direction opposite to the second direction D2. However, the present invention is not limited to this case. The motor MT may include, but is not limited to including, a hydraulic cylinder, a pneumatic cylinder, a gas cylinder, etc.

The actuators MP move the fixers FXP in a direction outward from the inspection window EW in a state where both ends of the inspection window EW are fixed by the fixers FXP. For example, the first attachment group CP2A of the second shape changer CP2 is moved in the direction opposite to the second direction D2, and the second attachment group CP2B of the second shape changer CP2 is moved in the second direction D2. Accordingly, the inspection window EW is stretched in the second direction D2 and the direction opposite to the second direction D2. As a result, the overall uniformity of the inspection window EW is increased.

The third shape changer CP3 may be disposed parallel to the inspection target panel IOP in the second direction D2. The third shape changer CP3 may change the shape of the inspection target panel IOP in the second direction D2 and the direction opposite to the second direction D2.

The third shape changer CP3 may include a first attachment group CP3A and a second attachment group CP3B. The first attachment group CP3A and the second attachment group CP2B of the third shape changer CP3 may face each other with the inspection target panel IOP interposed between them in the second direction D2. However, the present invention is not limited to this case. In some embodiments, the first attachment group CP3A and the second attachment group CP3B of the third shape changer CP3 may face each other with the inspection target panel IOP interposed between them in the first direction D1. In this case, the third shape changer CP3 may change the shape of the inspection target panel IOP in the first direction D1 and the direction opposite to the first direction D1. In addition, in some embodiments, the third shape changer CP3 may include a plurality of attachment groups facing each other with the inspection target panel IOP interposed between them in the first direction D1 and the second direction D2. In this case, the third shape changer CP3 may change the shape of the inspection target panel IOP in the first direction D1, the second direction D2, the direction opposite to the first direction D1 and the direction opposite to the second direction D2.

The configurations of the first attachment group CP3A and the second attachment group CP3B of the third shape changer CP3 are the same as those of the first attachment group CP2A and the second attachment group CP2B of the second shape changer CP2, and thus a detailed description thereof is omitted. To the extent that details have been omitted, it may be understood that the elements whose details have been omitted are at least similar to corresponding elements that are described in detail herein.

The first attachment group CP3A of the third shape changer CP3 is moved in the direction opposite to the second direction D2, and the second attachment group CP3B of the third shape changer CP3 is moved in the second direction D2. Accordingly, the inspection target panel IOP is stretched in the second direction D2 and the direction opposite to the second direction D2. As a result, the overall uniformity of the inspection target panel IOP is increased.

A length by which the inspection window EW is stretched by the second shape changer CP2 may be different from a length by which the inspection target panel IOP is stretched by the third shape changer CP3. For example, the length by which the inspection window EW is stretched by the second shape changer CP2 may be greater than the length by which the inspection target panel IOP is stretched by the third shape changer CP3. In some embodiments, the length by which the inspection window EW is stretched by the second shape changer CP2 may be equal to the length by which the inspection target panel IOP is stretched by the third shape changer CP3. In addition, in some embodiments, the length by which the inspection target panel IOP is stretched by the third shape changer CP3 may be greater than the length by which the inspection window EW is stretched by the second shape changer C2.

Figure 3:
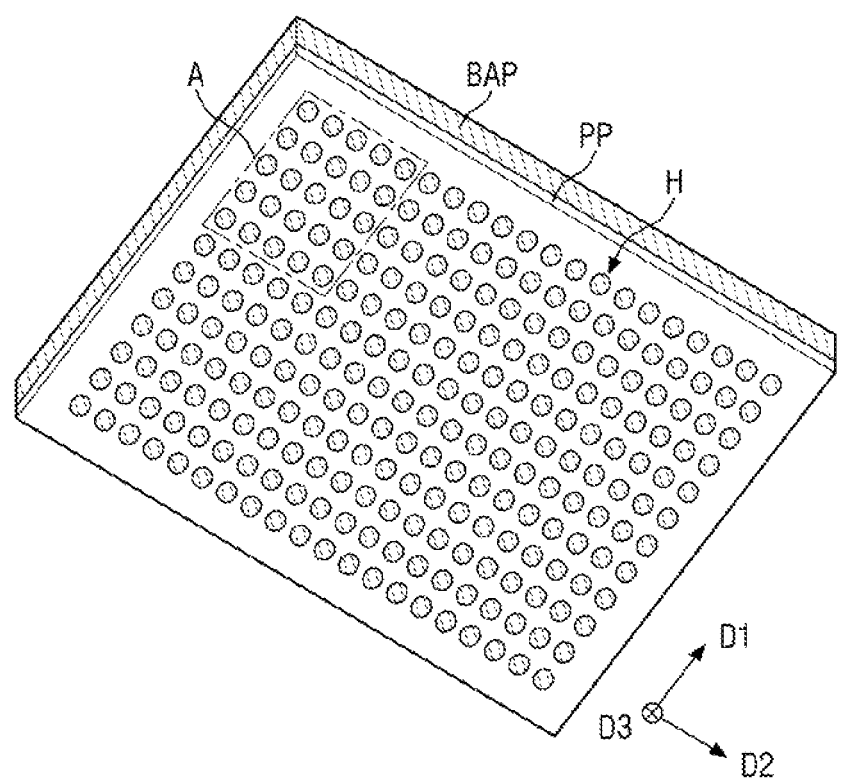
FIG. 3 is a schematic perspective view illustrating a first shape changer of an adhesion defect detection apparatus according to an exemplary embodiment of the present disclosure.
Figure 4:
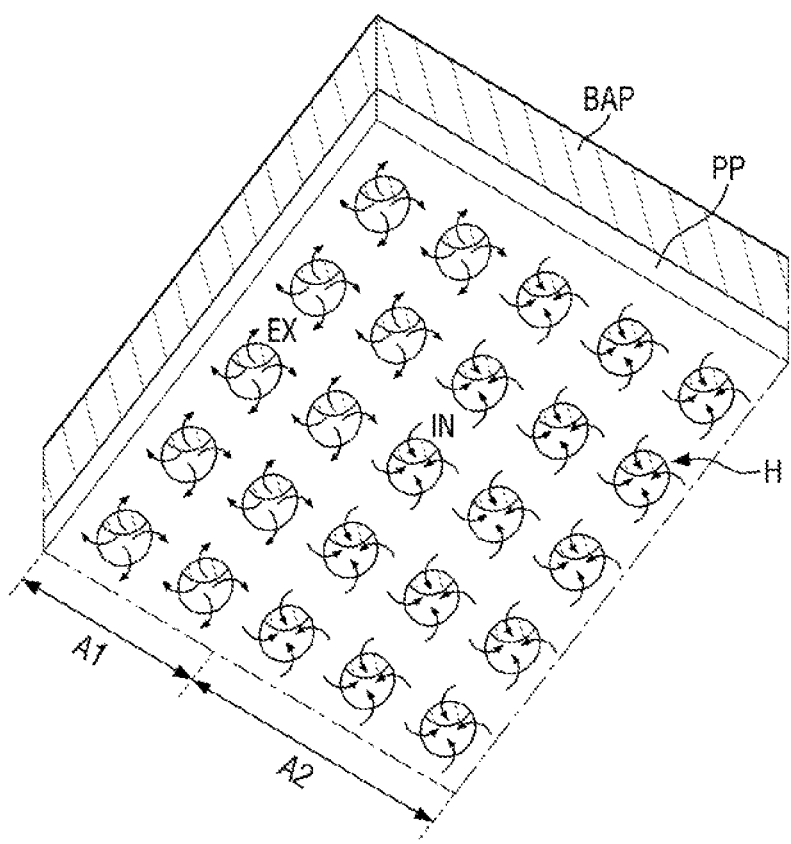
FIG. 4 is an enlarged view illustrating an area A of FIG. 3.
Figure 5:
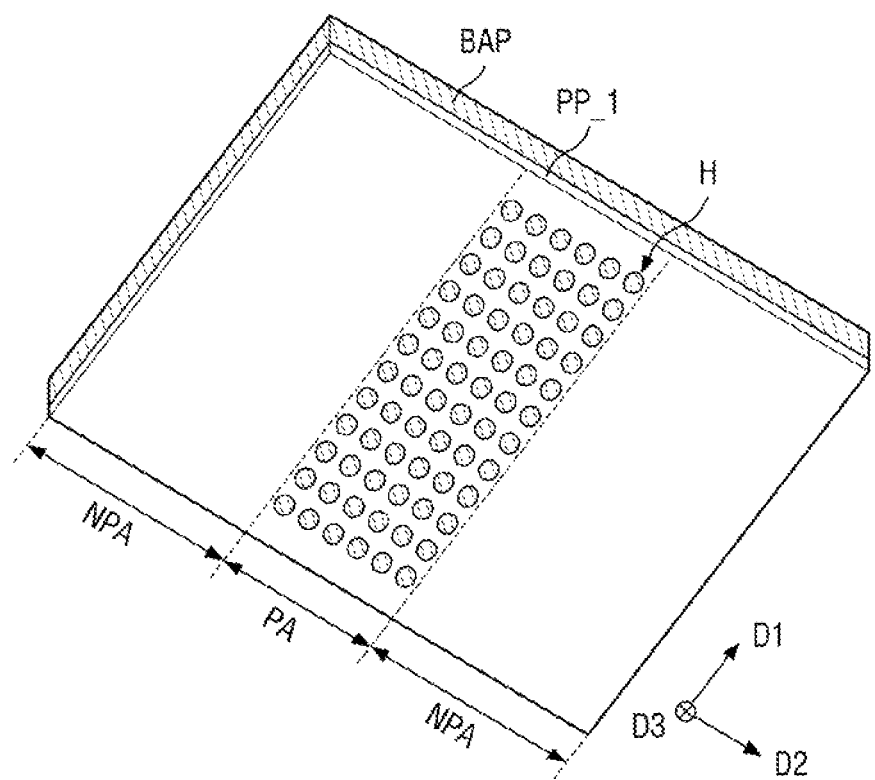
FIG. 5 is a schematic perspective view illustrating a first shape changer of an adhesion defect detection apparatus according to an exemplary embodiment of the present disclosure.
Figure 6:
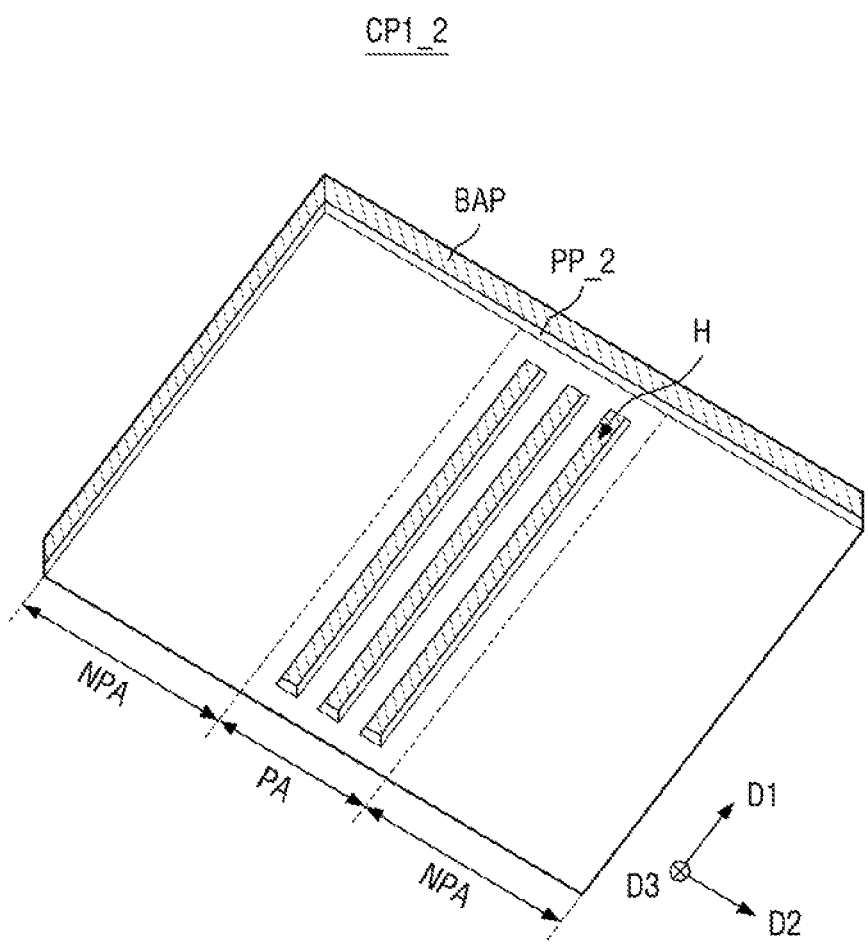
FIG. 6 is a schematic perspective view illustrating a first shape changer of an adhesion defect detection apparatus according to an exemplary embodiment of the present disclosure.
Figure 7:
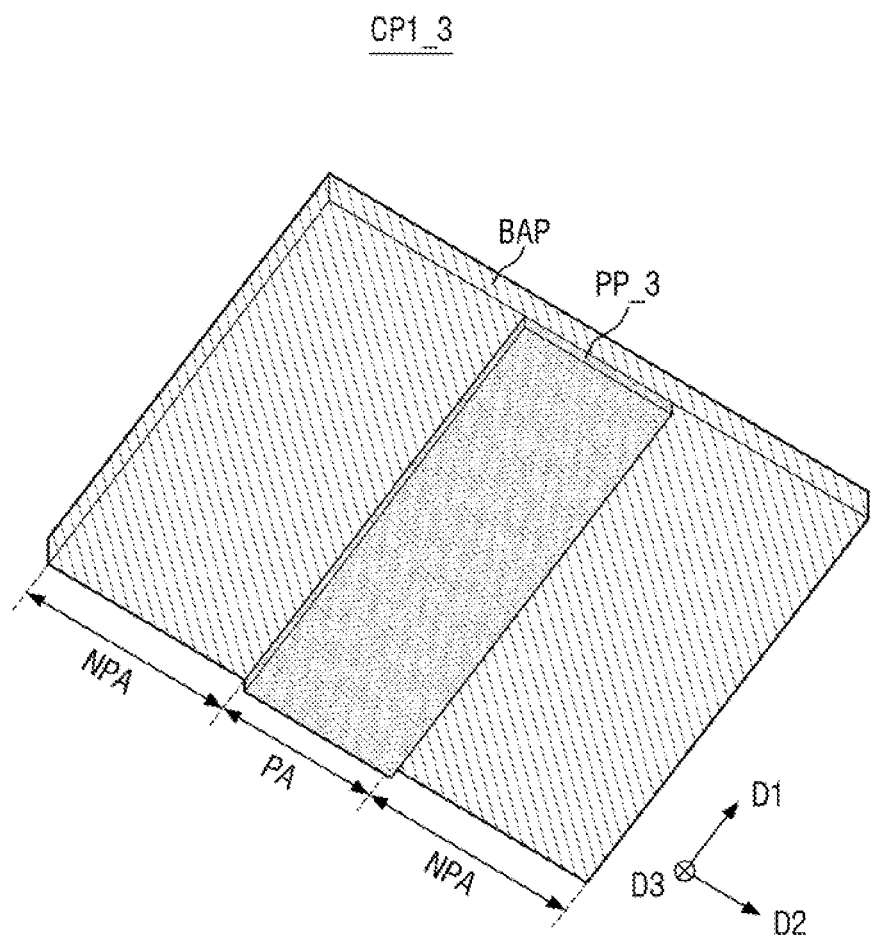
FIG. 7 is a schematic perspective view illustrating a first shape changer of an adhesion defect detection apparatus according to an exemplary embodiment of the present disclosure.

FIG. 3 is a schematic perspective view illustrating a first shape changer CP1 of an adhesion defect detection apparatus according to an exemplary embodiment of the present disclosure. FIG. 4 is an enlarged view illustrating an area A of FIG. 3. FIG. 5 is a schematic perspective view illustrating a first shape changer CP1_1 of an adhesion defect detection apparatus according to an exemplary embodiment of the present disclosure. FIG. 6 is a schematic perspective view illustrating a first shape changer CP1_2 of an adhesion defect detection apparatus according to an exemplary embodiment of the present disclosure. FIG. 7 is a schematic perspective view illustrating a first shape changer CP1_3 of an adhesion defect detection apparatus according to an exemplary embodiment of the present disclosure.

Referring to FIGS. 3 and 4, the first shape changer CP1 may include a base BAP and a pattern PP, and the pattern PP may include a plurality of holes H.

The holes H of the pattern PP may change the shape of an inspection window EW in the third direction D3 or the direction opposite to the third direction D3 according to air IN or EX sucked into or expelled from the base BAP. For example, the holes H of the pattern PP may change the shape of the inspection window EW in the third direction D3 according to air IN sucked into the base BAP and change the shape of the inspection window EW in the direction opposite to the third direction D3 according to air EX expelled from the base BAP.

In some embodiments, the first shape changer CP1 may change the shape of the inspection window EW differently in each area according to the flow of air IN or EX sucked in or expelled. For example, a first area A1 may expel air EX, and a second area A2 may suck in air IN. Accordingly, the shape of the inspection window EW corresponding to the first area A1 may be changed in the direction opposite to the third direction D3, and the shape of the inspection window EW corresponding to the second area A2 may be changed in the third direction D3. In addition, in some embodiments, the first shape changer CP1 may further include a non-driving area that does not suck in air IN nor expel air EX.

The holes H of the pattern PP may be disposed in the entire surface of the first shape changer CP1, and the number of the holes H may be 129. However, the present invention is not limited to this case. Referring to FIG. 5, the first shape changer CP1_1 may include a pattern area PA and a non-pattern area NPA disposed on both sides of the pattern area PA. The pattern area PA may correspond to an inspection area IA of an inspection window EW, and the non-pattern area NPA may correspond to a non-inspection area NIA of the inspection window EW.

A plurality of holes H may be disposed in a pattern PP_1 of the first shape changer CP1_1 to correspond to the pattern area PA. In addition, in some embodiments, a width of the pattern area PA in the second direction D2 may be greater than a width of the inspection area IA in the second direction D2. In some embodiments, the width of the pattern area PA in the second direction D2 may be equal to the width of the inspection area IA in the second direction D2, or the width of the pattern area PA in the second direction D2 may be smaller than the width of the inspection area IA in the second direction D2.

The holes H of the pattern PP_1 may be circular in plan view and may be spaced apart from each other. However, the present invention is not limited to this case. Referring to FIG. 6, in some embodiments, a plurality of holes H of a pattern PP_2 may be bar-shaped. For example, the pattern PP_2 of the first shape changer CP1_2 may include a plurality of bar-shaped holes H extending in the first direction D1 and spaced apart from each other in the second direction D2. In addition, in some embodiments, the bar-shaped holes H may be disposed only in a pattern area PA of the first shape changer CP1_2. In some embodiments, the bar-shaped holes H may be formed in the pattern area PA and a non-pattern area NPA of the first shape changer CP1_2.

Referring to FIG. 7, in some embodiments, a pattern PP_3 of the first shape changer CP1_3 may be made of an adhesive material and may be disposed in a pattern area PA. In some embodiments, the pattern PP_3 may be disposed in the pattern area PA and a non-pattern area NPA, and an adhesive material may be disposed in the pattern area PA. When the first shape changer CP1_3 is made of an adhesive material as described above, an element for sucking in and expelling air can be omitted from a base BAP.

Figure 8:
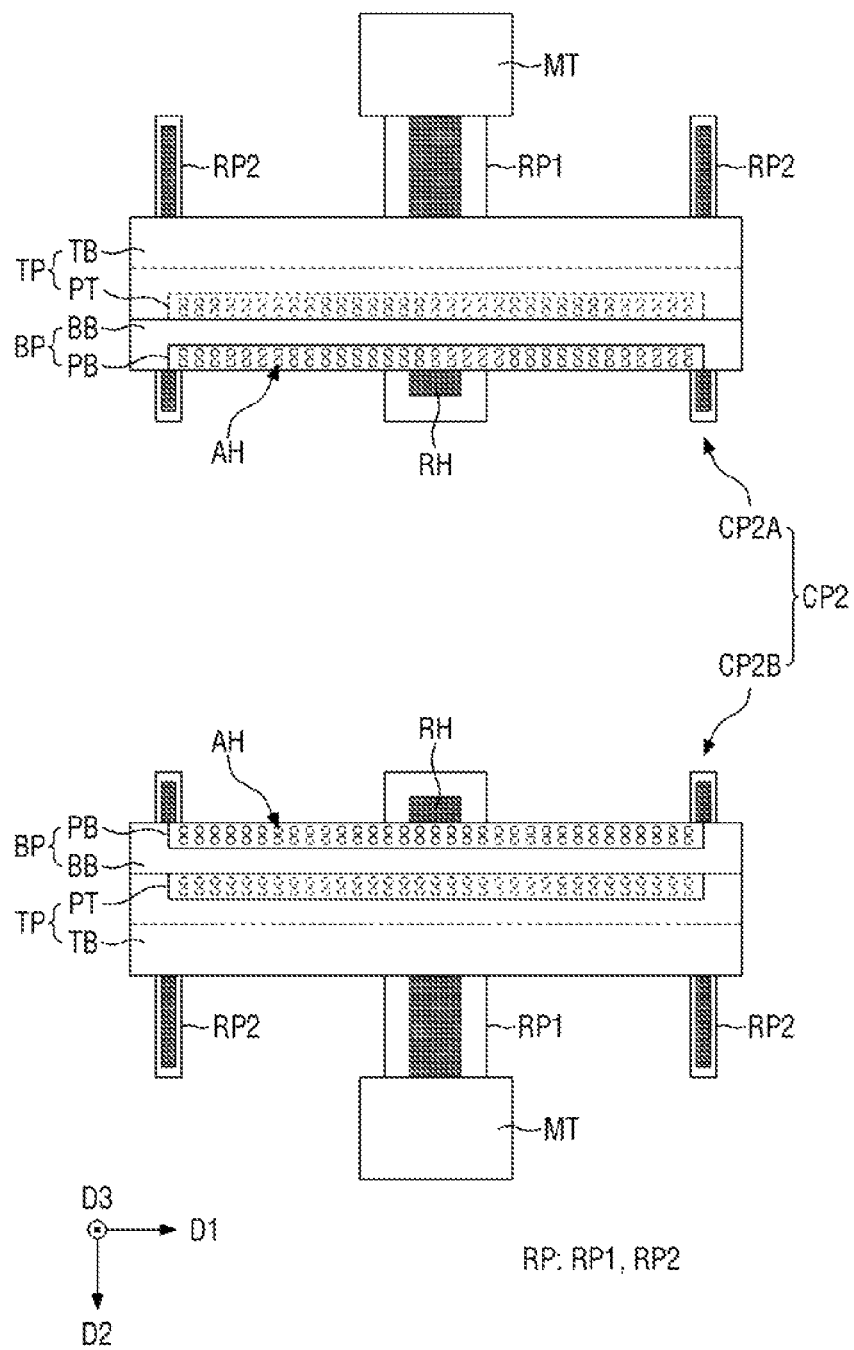
FIG. 8 is a schematic plan view illustrating a second shape changer of an adhesion defect detection apparatus according to an exemplary embodiment of the present disclosure.
Figure 9:
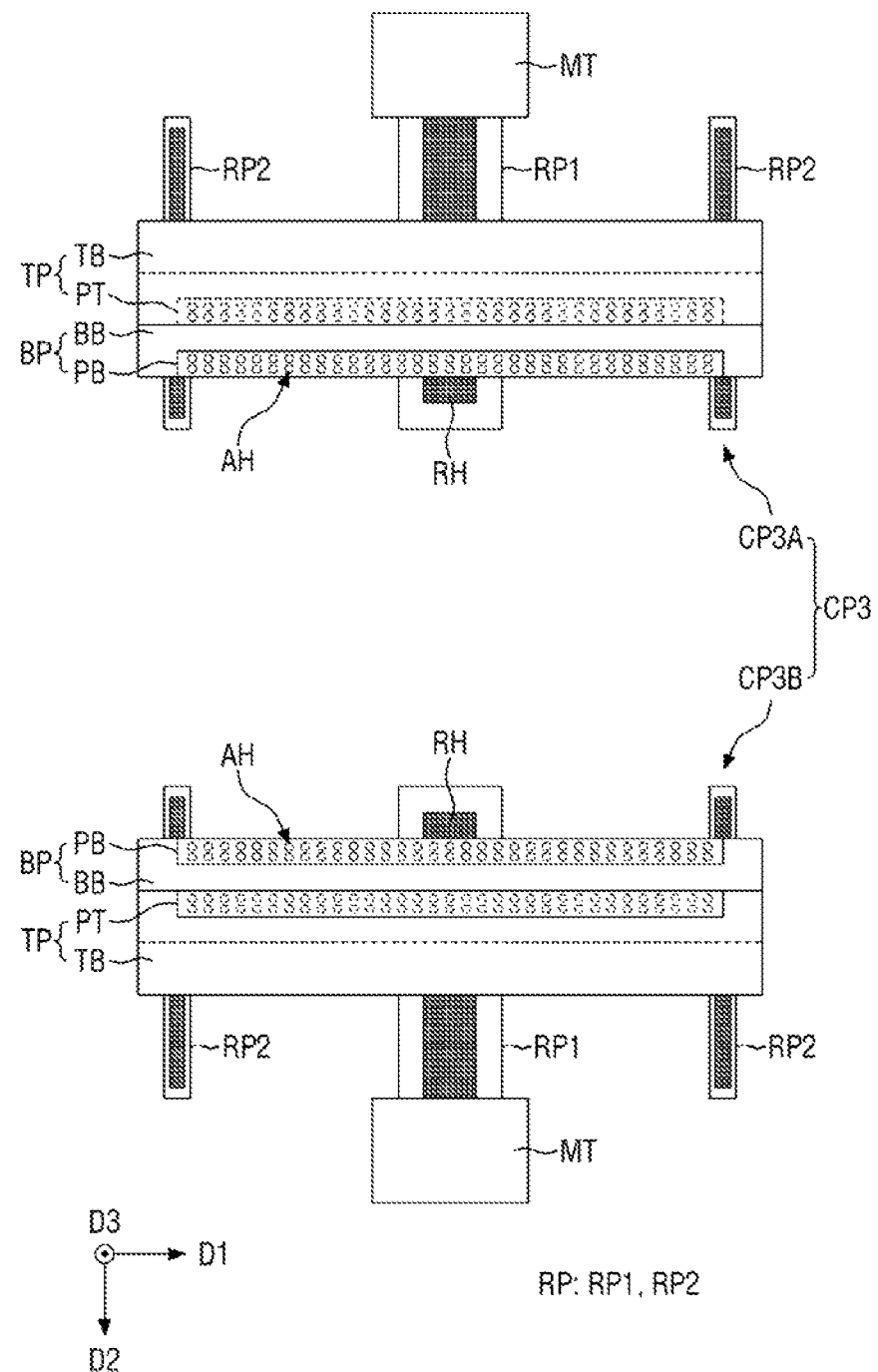
FIG. 9 is a schematic plan view illustrating a third shape changer of an adhesion defect detection apparatus according to an exemplary embodiment of the present disclosure.
Figure 10:
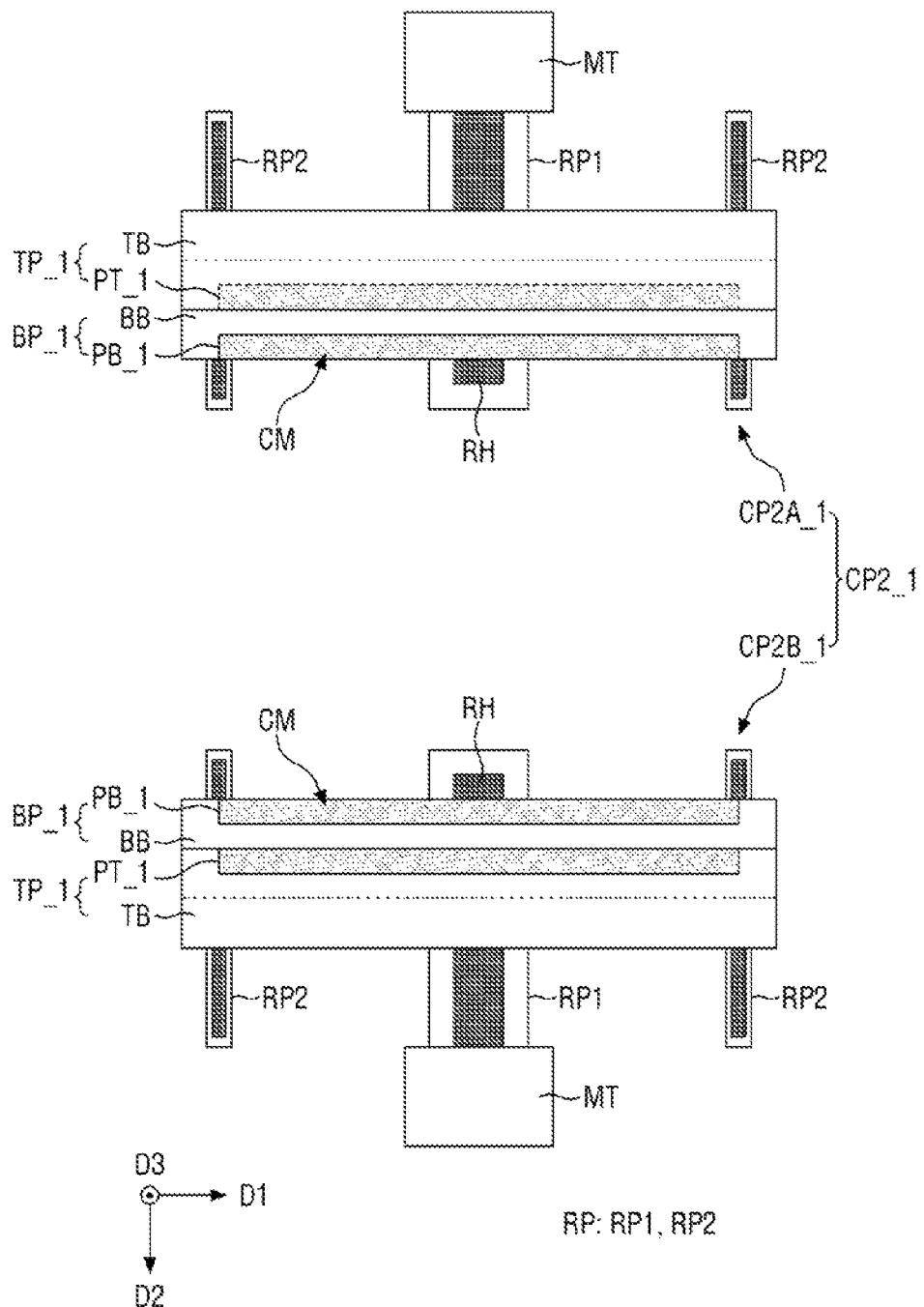
FIG. 10 is a schematic plan view illustrating a second shape changer of an adhesion defect detection apparatus according to an exemplary embodiment of the present disclosure.
Figure 11:
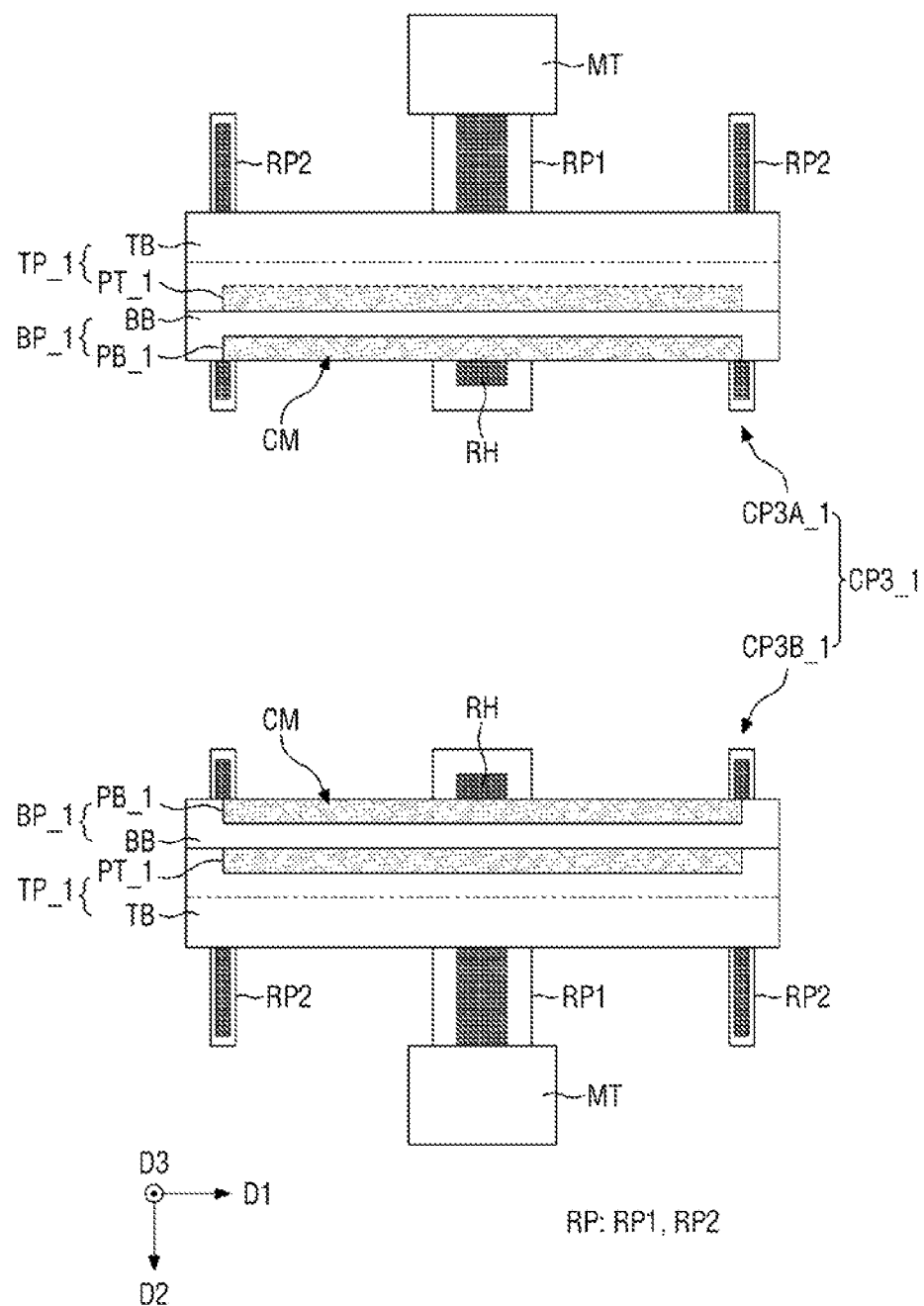
FIG. 11 is a schematic plan view illustrating a third shape changer of an adhesion defect detection apparatus according to an exemplary embodiment of the present disclosure.

FIG. 8 is a schematic plan view illustrating a second shape changer CP2 of an adhesion defect detection apparatus according to an exemplary embodiment of the present disclosure. FIG. 9 is a schematic plan view illustrating a third shape changer CP3 of an adhesion defect detection apparatus according to an exemplary embodiment of the present disclosure. FIG. 10 is a schematic plan view illustrating a second shape changer CP2_1 of an adhesion defect detection apparatus according to an exemplary embodiment of the present disclosure. FIG. 11 is a schematic plan view illustrating a third shape changer CP3_1 of an adhesion defect detection apparatus according to an exemplary embodiment of the present disclosure.

Referring to FIG. 8, a lower portion BP of each of a first attachment group CP2A and a second attachment group CP2B of the second shape changer CP2 may be placed on a movement guide RP. The movement guide RP may include tracks, rails, or some other structure configured for movement along a predetermined path. The movement guide RP may include a first movement guide RP1 connected to a motor MT and a second movement guide RP2 disposed in each of the first direction D1 and the direction opposite to the first direction D1 from the first movement guide RP1. The lower portion BP of each of the first attachment group CP2A and the second attachment group CP2B of the second shape changer CP2 may be placed on the first movement guide RP1 and the second movement guide RP2. A guide groove RH may be formed in each of the first movement guide RP1 and the second movement guide RP2, and each of the first attachment group CP2A and the second attachment group CP2B may reciprocate in the second direction D2 and the direction opposite to the second direction D2 along the guide groove RH.

An upper pad PT and a lower pad PB for fixing an inspection window EW are disposed in each of the first attachment group CP2A and the second attachment group CP2B of the second shape changer CP2 as described above. In a state where the inspection window EW is fixed by the upper pad PT and the lower pad PB, the first attachment group CP2A moves in the direction opposite to the second direction D2, and the second attachment group CP2B moves in the second direction D2, thereby stretching the inspection window EW.

A length of the upper pad PT of the second shape changer CP2 in the first direction D1 may be smaller than a length of an upper base TB in the first direction D1, and a length of the lower pad PB of the second shape changer CP2 in the first direction D1 may be smaller than a length of a lower base BB in the first direction D1. However, the present invention is not limited to this case. In some embodiments, the length of the upper pad PT of the second shape changer CP2 in the first direction D1 may be equal to the length of the upper base TB in the first direction D1, and the length of the lower pad PB of the second shape changer CP2 in the first direction D1 may be equal to the length of the lower base BB in the first direction D1.

The length of the upper base TB of the second shape changer CP2 in the first direction D1 may be equal to a length of the inspection window EW in the first direction D1, and the length of the lower base BB of the second shape changer CP2 in the first direction D1 may be equal to the length of the inspection window EW in the first direction D1. However, the present invention is not limited to this case. In some embodiments, the lengths of the upper base TB and the lower base BB of the second shape changer CP2 in the first direction D1 may be different from the length of the inspection window EW in the first direction D1.

Referring to FIG. 9, the configuration of the third shape changer CP3 is substantially the same as the configuration of the second shape changer CP2, and thus a detailed description of the configuration of the third shape changer CP3 is omitted. To the extent that details have been omitted, it may be understood that the elements whose details have been omitted are at least similar to corresponding elements that are described in detail herein.

In some embodiments, a length of the third shape changer CP3 in the first direction D1 may be different from a length of the second shape changer CP2 in the first direction D1. For example, since the area of the inspection window EW is larger than the area of an inspection target panel IOP, the length (in the first direction D1) of the second shape changer CP2 for fixing and stretching the inspection window EW may be greater than the length (in the first direction D1) of the third shape changer CP3 for fixing and stretching the inspection target panel IOP. In some embodiments, the length of the second shape changer CP2 in the first direction D1 may be equal to the length of the third shape changer CP3 in the first direction D1. In this case, the second shape changer CP2 and the third shape changer CP3 can be formed using the same process.

The upper pad PT and the lower pad PB included in each of the second shape changer CP2 and the third shape changer CP3 may be made of a porous vacuum pad having a plurality of air holes AH. However, the present invention is not limited to this case. Referring to FIGS. 10 and 11, an upper pad PT_1 and a lower pad PB_1 included in each of the second shape changer CP2_1 and the third shape changer CP3_1 may be made of an adhesive material CM. In this case, the configuration of each of the second shape changer CP2_1 and the third shape changer CP3_1 can be simplified. In addition, in some embodiments, the upper pad PT_1 and the lower pad PB_1 included in the second shape changer CP2_1 may be made of the adhesive material CM, and the upper pad PT and the lower pad PB included in the third shape changer CP3 may be made of a porous vacuum pad. In this case, the configuration of the second shape changer CP2_1 can be simplified, and the inspection target panel IOP fixed by the third shape changer CP3 can be prevented from being damaged by the adhesive material CM.

Figure 46:
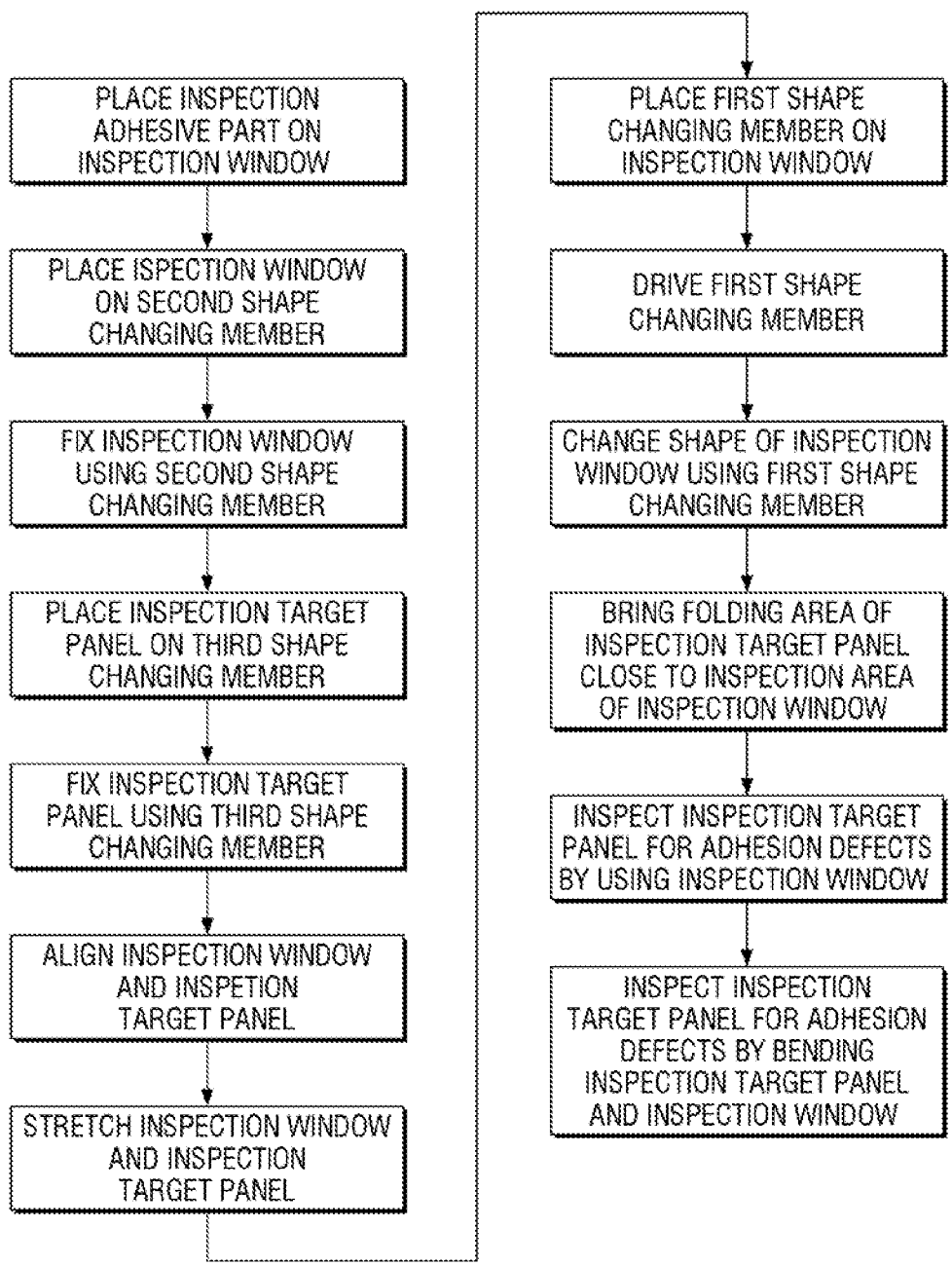
FIG. 46 is a flowchart illustrating an adhesion defect detection method using an adhesion defect detection apparatus according to an exemplary embodiment of the present disclosure.

An adhesion defect detection method using an adhesion defect detection apparatus according to an exemplary embodiment of the present disclosure will now be described with reference to FIGS. 12 through 27. FIG. 46 is a flowchart illustrating an adhesion defect detection method using an adhesion defect detection apparatus according to an exemplary embodiment of the present disclosure. The following description will be given with reference to FIG. 46 as well.

Figure 12:
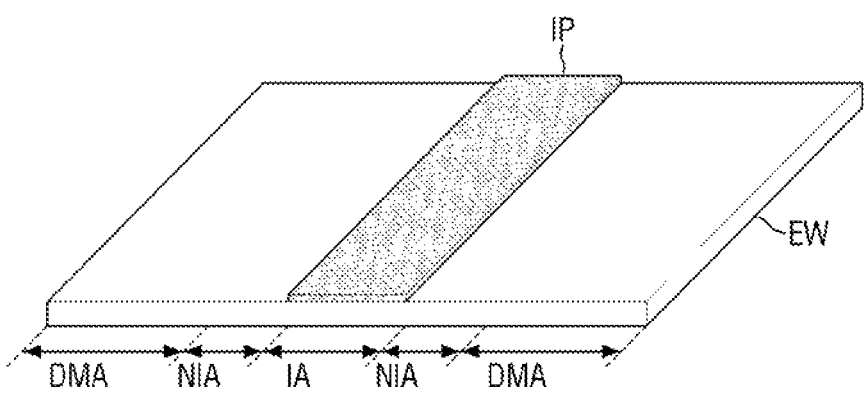
FIG. 12 is a schematic perspective view illustrating an operation of placing an inspection adhesive on an inspection window in an adhesion defect detection method using an adhesion defect detection apparatus according to an exemplary embodiment of the present disclosure.

FIG. 12 is a schematic perspective view illustrating an operation of placing an inspection adhesive on an inspection window in an adhesion defect detection method using an adhesion defect detection apparatus according to an exemplary embodiment of the present disclosure.

Referring to FIG. 12, an inspection adhesive IP is placed on a surface of an inspection window EW. As described above, the inspection window EW includes an inspection area IA, a non-inspection area NIA and a dummy area DMA, and the inspection adhesive IP is placed on the inspection area IA of the inspection window EW. In some embodiments, the inspection adhesive IP may have the same area as the inspection area IA of the inspection window EW. In some embodiments, the inspection adhesive IP may have a smaller area than the inspection area IA of the inspection window EW or have a larger area than the inspection area IA of the inspection window EW.

The inspection adhesive IP may include an OCA. However, to increase the accuracy of adhesion defect detection, the inspection adhesive IP may be made of an adhesive actually used to bond an inspection target panel IOP to a cover window as described above.

Figure 13:
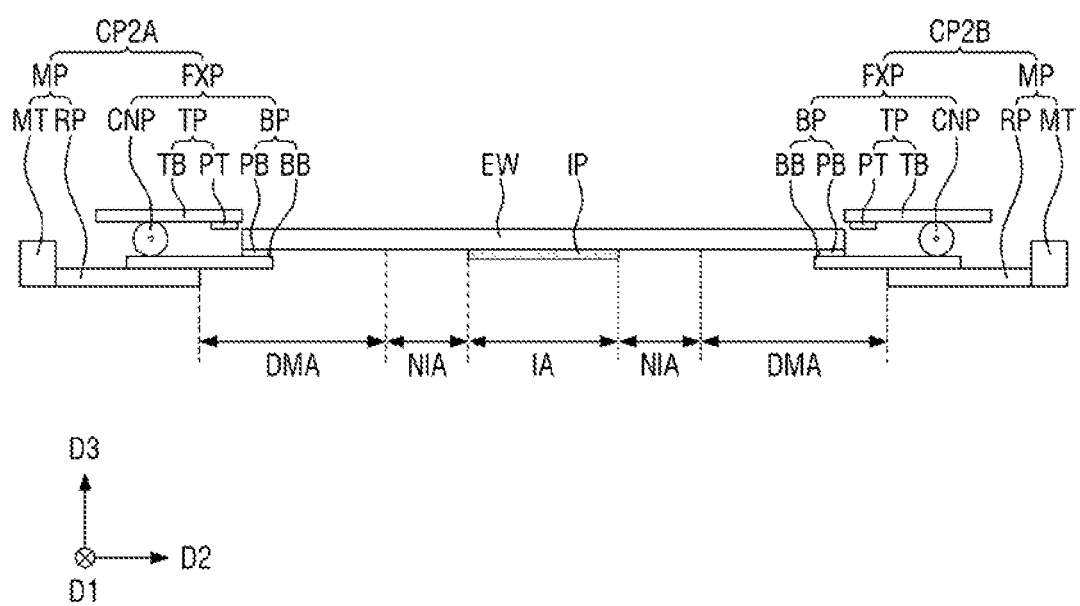
FIG. 13 is a schematic cross-sectional view illustrating an operation of placing the inspection window on a second shape changer in the adhesion defect detection method using the adhesion defect detection apparatus according to an exemplary embodiment of the present disclosure.

FIG. 13 is a schematic cross-sectional view illustrating an operation of placing the inspection window on a second shape changer in the adhesion defect detection method using the adhesion defect detection apparatus according to an exemplary embodiment of the present disclosure.

Referring to FIG. 13, the inspection window EW to which the inspection adhesive IP is attached is placed on a second shape changer CP2. For example, an upper portion TP of a first attachment group CP2A included in the second shape changer CP2 may move in the direction opposite to the second direction D2, and an upper portion TP of a second attachment group CP2B may move in the second direction D2. Accordingly, an upper surface of a lower portion BP of each of the first attachment group CP2A and the second attachment group CP2B is exposed.

Next, the inspection window EW is placed on the lower portion BP of each of the first attachment group CP2A and the second attachment group CP2B such that the inspection adhesive IP faces downward.

An area of the inspection window EW which is placed on the lower portion BP of each of the first attachment group CP2A and the second attachment group CP2B may be the dummy area DMA of the inspection window EW. However, the present invention is not limited to this case. In some embodiments, the dummy area DMA and the non-inspection area NIA may be placed on the lower portion BP of each of the first attachment group CP2A and the second attachment group CP2B.

A portion of the dummy area DMA of a lower surface (a surface on which the inspection adhesive IP is disposed) of the inspection window EP placed on the lower portion BP of each of the first attachment group CP2A and the second attachment group CP2B is fixed by a lower pad PB of the lower portion BP.

Figure 14:
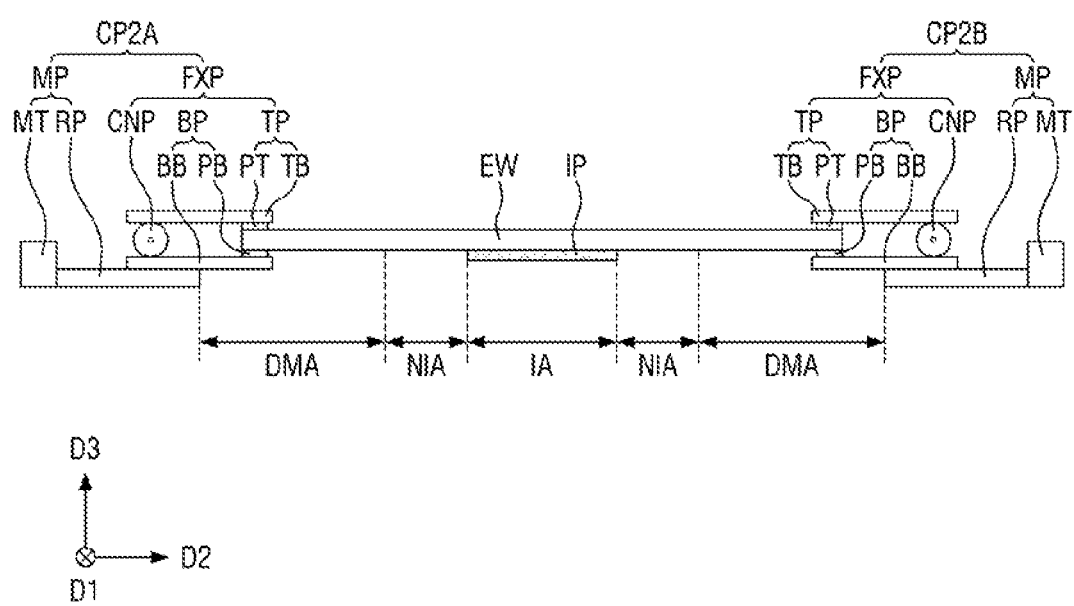
FIG. 14 is a schematic cross-sectional view illustrating an operation of fixing the inspection window using the second shape changer in the adhesion defect detection method using the adhesion defect detection apparatus according to an exemplary embodiment of the present disclosure.

FIG. 14 is a schematic cross-sectional view illustrating an operation of fixing the inspection window using the second shape changer in the adhesion defect detection method using the adhesion defect detection apparatus according to an exemplary embodiment of the present disclosure.

Referring to FIG. 14, the upper portion TP of the first attachment group CP2A included in the second shape changer CP2 moves in the second direction D2, and the upper portion TP of the second attachment group CP2B moves in the direction opposite to the second direction D2 to cover ends of the dummy area DMA of the inspection window EW. In some embodiments, the upper portion TP of each of the first attachment group CP2A and the second attachment group CP2B and the lower portion BP of each of the first attachment group CP2A and the second attachment group CP2B may be aligned in the third direction D3. In some embodiments, any one of the upper portion TP and the lower portion BP may protrude in the second direction D2 or the direction opposite to the second direction D2.

The upper portion TP of each of the first attachment group CP2A and the second attachment group CP2B fixes a portion of the dummy area DMA of an upper surface (a surface opposite the surface on which the inspection adhesive IP is disposed) of the inspection window EW using an upper pad PT. Accordingly, the inspection window EW is fixed by the first attachment group CP2A and the second attachment group CP2B.

FIG. 15 is a schematic cross-sectional view illustrating an operation of placing an inspection target panel on a third shape changer in the adhesion defect detection method using the adhesion defect detection apparatus according to an exemplary embodiment of the present disclosure.

Referring to FIG. 15, the inspection target panel IOP is placed on a third shape changer CP3. For example, an upper portion TP of a first attachment group CP3A included in the third shape changer CP3 moves in the direction opposite to the second direction D2, and an upper portion TP of a second attachment group CP3B moves in the second direction D2. Accordingly, an upper surface of a lower portion BP of each of the first attachment group CP3A and the second attachment group CP3B is exposed.

Next, the inspection target panel IOP is placed on the lower portion BP of each of the first attachment group CP3A and the second attachment group CP3B such that a surface to which the cover window is attached faces upward.

An area of the inspection target panel IOP which is placed on the lower portion BP of each of the first attachment group CP3A and the second attachment group CP3B may be an end of a non-folding area NFA of the inspection target panel IOP.

An end of a lower surface of the inspection target panel IOP placed on the lower portion BP of each of the first attachment group CP3A and the second attachment group CP3B is fixed by a lower pad PB of the lower portion BP.

FIG. 16 is a schematic cross-sectional view illustrating an operation of fixing the inspection target panel using the third shape changer in the adhesion defect detection method using the adhesion defect detection apparatus according to an exemplary embodiment of the present disclosure.

Referring to FIG. 16, the upper portion TP of the first attachment group CP3A included in the third shape changer CP3 moves in the second direction D2, and the upper portion TP of the second attachment group CP3B moves in the direction opposite to the second direction D2 to cover both ends of an upper surface of the inspection target panel IOP.

The upper portion TP of each of the first attachment group CP3A and the second attachment group CP3B fixes both ends of the upper surface of the inspection target panel IOP using an upper pad PT. Accordingly, the inspection target panel IOP is fixed by the first attachment group CP3A and the second attachment group CP3B.

Figure 17:
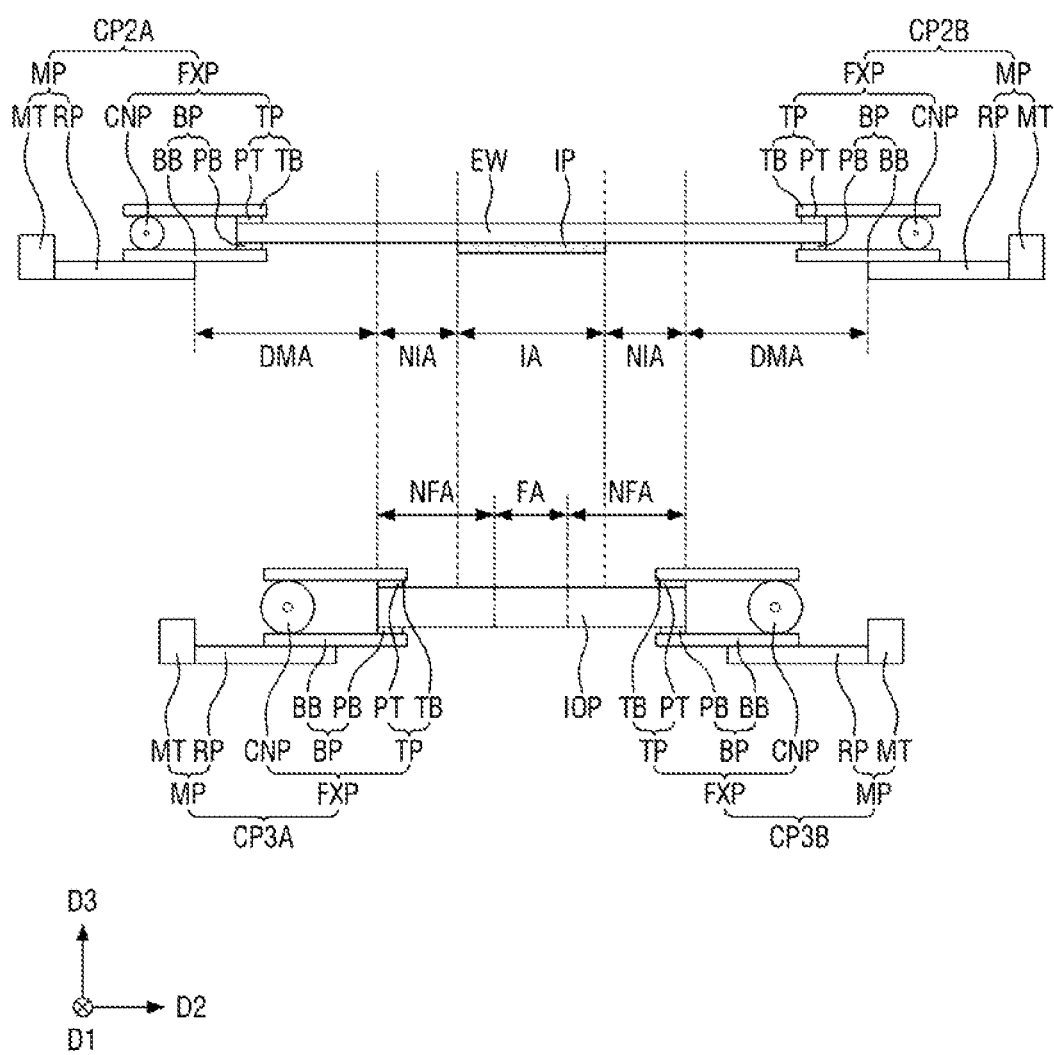
FIG. 17 is a schematic cross-sectional view illustrating an operation of aligning the inspection window and the inspection target panel in the adhesion defect detection method using the adhesion defect detection apparatus according to an exemplary embodiment of the present disclosure.

FIG. 17 is a schematic cross-sectional view illustrating an operation of aligning the inspection window and the inspection target panel in the adhesion defect detection method using the adhesion defect detection apparatus according to an exemplary embodiment of the present disclosure.

Referring to FIG. 17, the inspection window EW and the inspection target panel IOP are aligned to at least partially overlap each other in the third direction D3. For example, the inspection target panel IOP is fixed by the third shape changer CP3, and the inspection window EW fixed by the second shape changer CP2 is placed on the fixed inspection target panel IOP. Here, the inspection adhesive IP of the inspection window EW and the upper surface of the inspection target panel IOP are placed to face each other, and the inspection area IA of the inspection window EW, the inspection adhesive IP and a folding area FA of the inspection target panel IOP at least partially overlap each other in the third direction D3.

In consideration of the fact that the inspection area IA of the inspection window EW and the inspection adhesive IP are changed in shape by a first shape changer in the third direction D3, widths of the inspection area IA of the inspection window EW and the inspection adhesive IP in the second direction D2 are greater than a width of the folding area FA of the inspection target panel IOP in the second direction D2. However, the present invention is not limited to this case. In some embodiments, the widths of the inspection area IA of the inspection window EW and the inspection adhesive IP in the second direction D2 may be equal to the width of the folding area FA of the inspection target panel IOP in the second direction D2.

Figure 18:
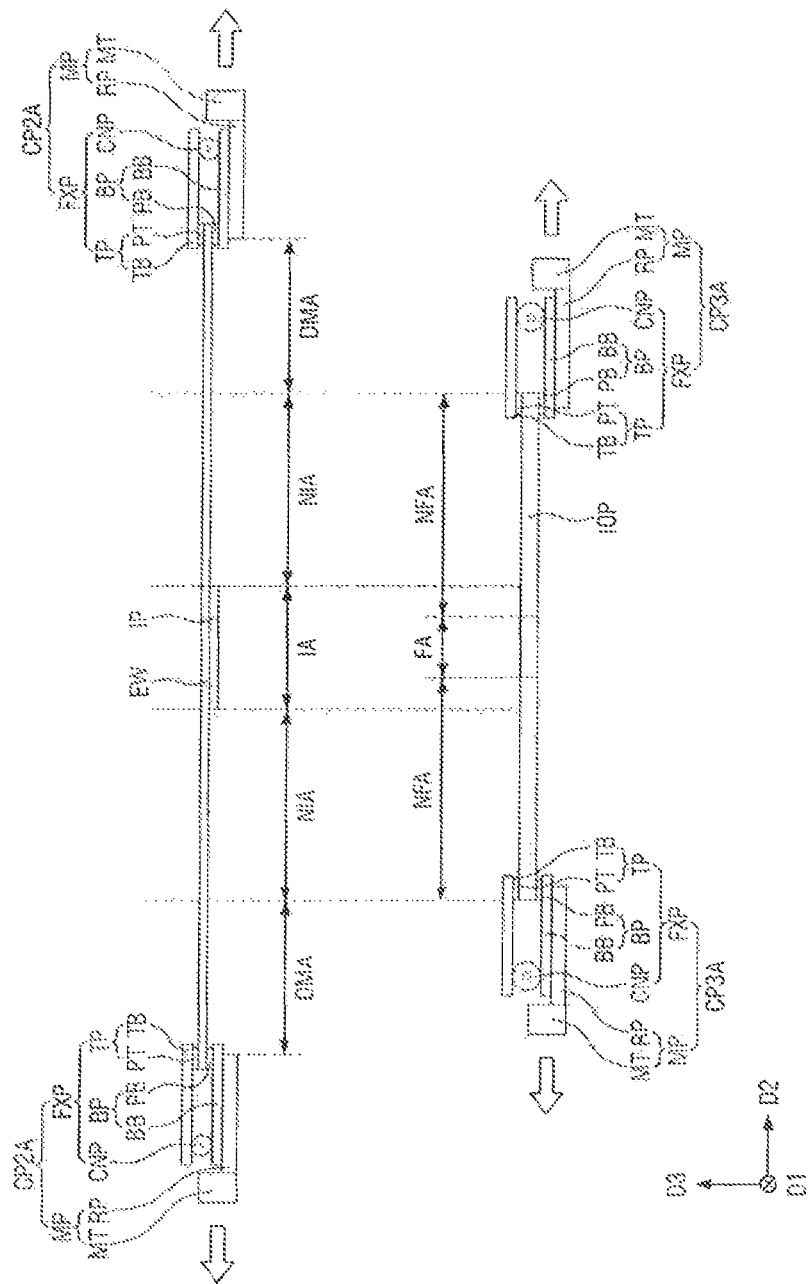
FIG. 18 is a schematic cross-sectional view illustrating an operation of stretching the inspection window and the inspection target panel in the adhesion defect detection method using the adhesion defect detection apparatus according to an exemplary embodiment of the present disclosure.

FIG. 18 is a schematic cross-sectional view illustrating an operation of stretching the inspection window and the inspection target panel in the adhesion defect detection method using the adhesion defect detection apparatus according to an exemplary embodiment of the present disclosure.

In a state where the inspection window EW and the inspection target panel IOP are aligned with each other, to increase the overall uniformity of the inspection window EW, the first attachment group CP2A of the second shape changer CP2 moves in the direction opposite to the second direction D2, and the second attachment group CP2B of the second shape changer CP2 moves in the second direction D2 to stretch the inspection window EW in the second direction D2 and the direction opposite to the second direction D2. However, the present invention is not limited to this case, and one of the first attachment group CP2A and the second attachment group CP2B may be fixed, and the other one may be moved to stretch the inspection window EW.

In addition, to increase the overall uniformity of the inspection target panel IOP, the first attachment group CP3A of the third shape changer CP3 moves in the direction opposite to the second direction D2, and the second attachment group CP3B of the third shape changer CP3 moves in the second direction D2 to stretch the inspection target panel IOP in the second direction D2 and the direction opposite to the second direction D2. However, the present invention is not limited to this case, and one of the first attachment group CP3A and the second attachment group CP3B may be fixed, and the other one may be moved to stretch the inspection target panel IOP.

The stretching of the inspection window EW and the stretching of the inspection target panel IOP may be performed at the same time or different times.

As described above, a length by which the inspection window EW is stretched by the second shape changer CP2 and a length by which the inspection target panel IOP is stretched by the third shape changer CP2 may be the same or different depending on the size and material of each of the inspection window EW and the inspection target panel IOP.

Figure 19:
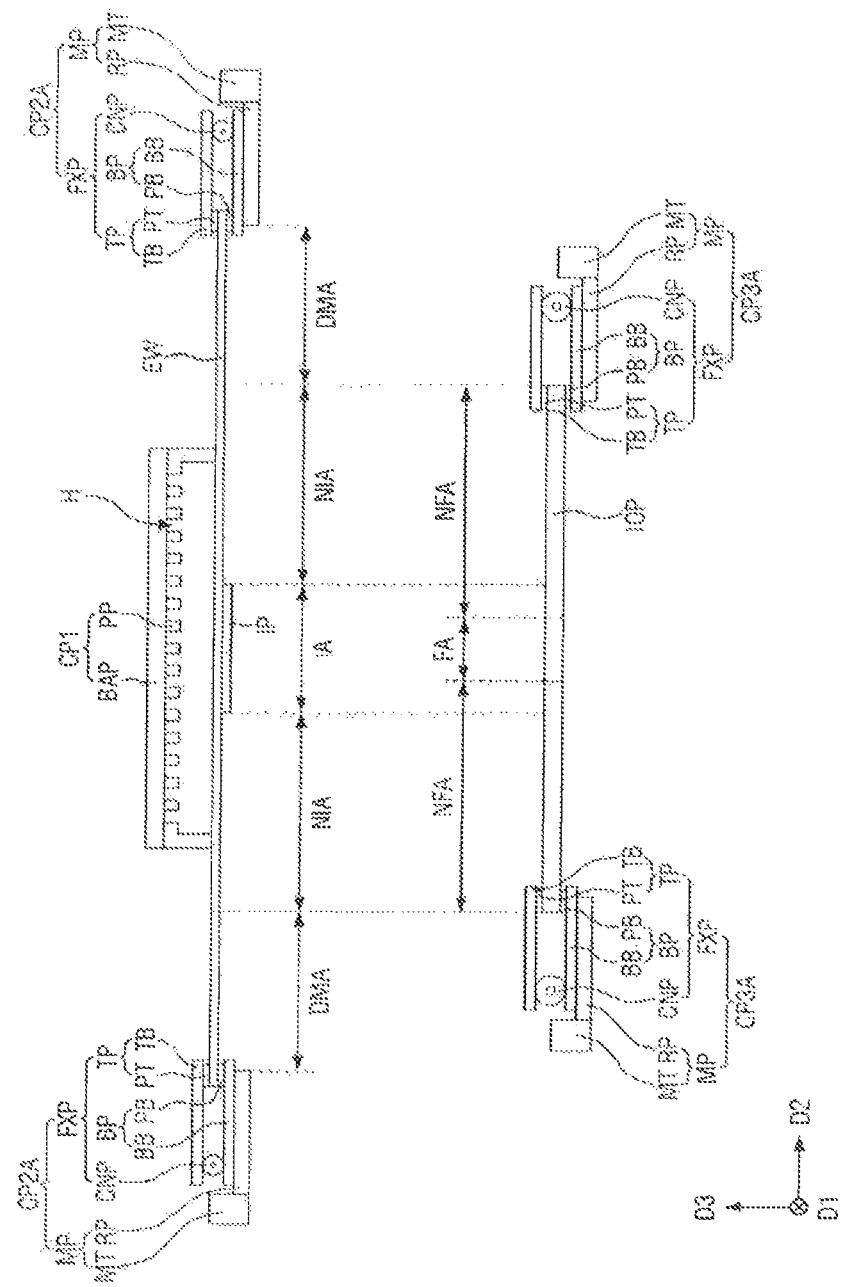
FIG. 19 is a schematic cross-sectional view illustrating an operation of placing a first shape changer on the inspection window in the adhesion defect detection method using the adhesion defect detection apparatus according to an exemplary embodiment of the present disclosure.

FIG. 19 is a schematic cross-sectional view illustrating an operation of placing a first shape changer on the inspection window in the adhesion defect detection method using the adhesion defect detection apparatus according to an exemplary embodiment of the present disclosure.

In a state where the inspection window EW is stretched, a first shape changer CP1 is placed on the inspection window EW. The first shape changer CP1 has a smaller width than the inspection window EW in the second direction D2 but has a greater width than the inspection area IA of the inspection window EW and at least partially overlaps the inspection area IA of the inspection window EW. Accordingly, the folding area FA of the inspection target panel IOP, the inspection adhesive IP, the inspection area IA of the inspection window EW, and the first shape changer CP1 at least partially overlap each other in the third direction D3.

As described above, a portion of the non-folding area NFA of the inspection target panel IOP may also at least partially overlap the inspection adhesive IP, the inspection area IA of the inspection window EW, and the first shape changer CP1.

Figure 20:
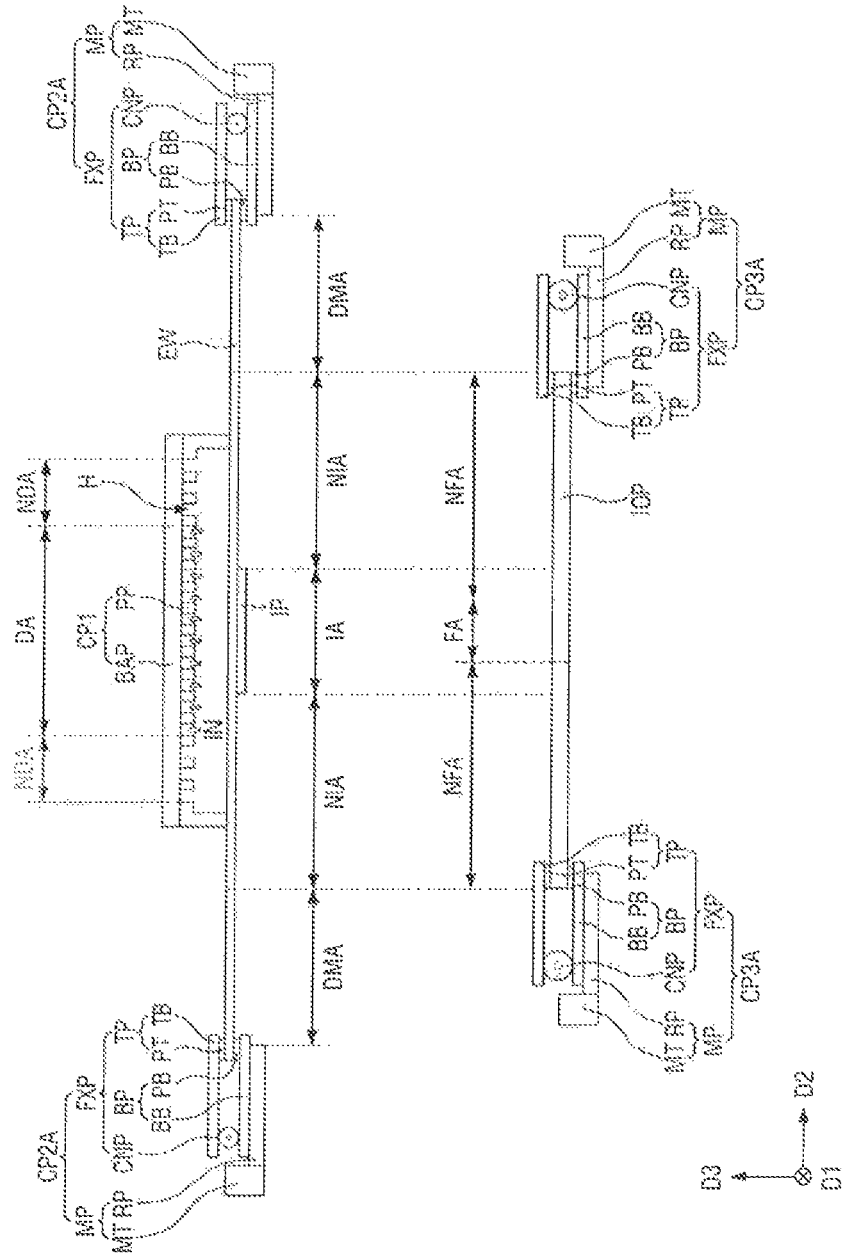
FIG. 20 is a schematic cross-sectional view illustrating an operation of driving the first shape changer in the adhesion defect detection method using the adhesion defect detection apparatus according to an exemplary embodiment of the present disclosure.

FIG. 20 is a schematic cross-sectional view illustrating an operation of driving the first shape changer in the adhesion defect detection method using the adhesion defect detection apparatus according to an exemplary embodiment of the present disclosure.

Referring to FIG. 20, in some embodiments, the first shape changer CP1 includes a base BAP and a pattern PP, and the pattern PP includes a plurality of holes H. The first shape changer CP can be driven on an area-by-area basis, and the holes H of the pattern PP may suck in air IN or expel air EX according to the driving of the first shape changer CP1.

In a state where the first shape changer CP1 is placed on the inspection window EW, the first shape changer CP1 sets an area corresponding to the inspection area IA of the inspection window EW as a driving area DA and sets an area other than the driving area DA as a non-driving area NDA. A width of the driving area DA in the second direction D2 may be greater than a width of the inspection area IA of the inspection window EW. However, the present invention is not limited to this case. In some embodiments, the width of the driving area DA in the second direction D2 may be equal to the width of the inspection area IA of the inspection window EW.

The holes H of the pattern PP disposed in the driving area DA suck in air IN according to the driving of the first shape changer CP1.

Figure 21:
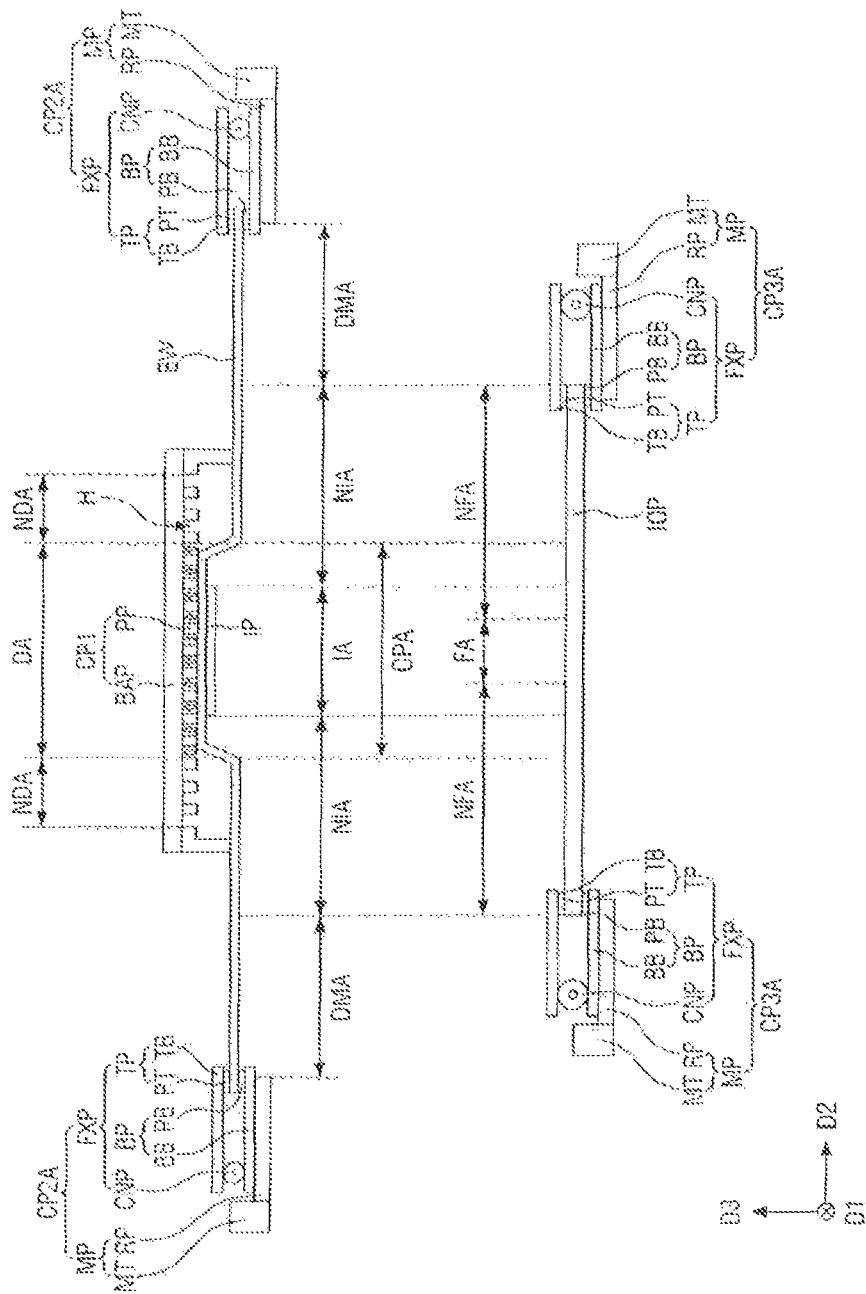
FIG. 21 is a schematic cross-sectional view illustrating an operation of changing the shape of the inspection window using the first shape changer in the adhesion defect detection method using the adhesion defect detection apparatus according to an exemplary embodiment of the present disclosure.

FIG. 21 is a schematic cross-sectional view illustrating an operation of changing the shape of the inspection window using the first shape changer in the adhesion defect detection method using the adhesion defect detection apparatus according to an exemplary embodiment of the present disclosure.

Referring to FIG. 21, the holes H of the pattern PP disposed in the driving area DA suck in air IN according to the driving of the first shape changer CP1, and the shape of the inspection window EW corresponding to the driving area DA is changed in the third direction D3. Here, the inspection adhesive IP disposed on the lower surface of the inspection window EW is also moved in the third direction D3. In the inspection window EW, an area whose shape is changed by the first shape changer CP1 is defined as a shape change area CPA. Heights of the shape change area CPA of the inspection window EW and the inspection adhesive IP in the third direction D3 may be greater than that of an area other than the shape change area CPA of the inspection window EW.

The shape change area CPA at least partially overlaps the folding area FA of the inspection target panel IOP in the third direction D3, and a width of the shape change area CPA in the second direction D2 is greater than that of the folding area FA of the inspection target panel IOP in the second direction D2. However, the present invention is not limited to this case. In some embodiments, the width of the shape change area CPA in the second direction D2 may be equal to the width of the folding area FA of the inspection target panel IOP in the second direction D2.

Figure 22:
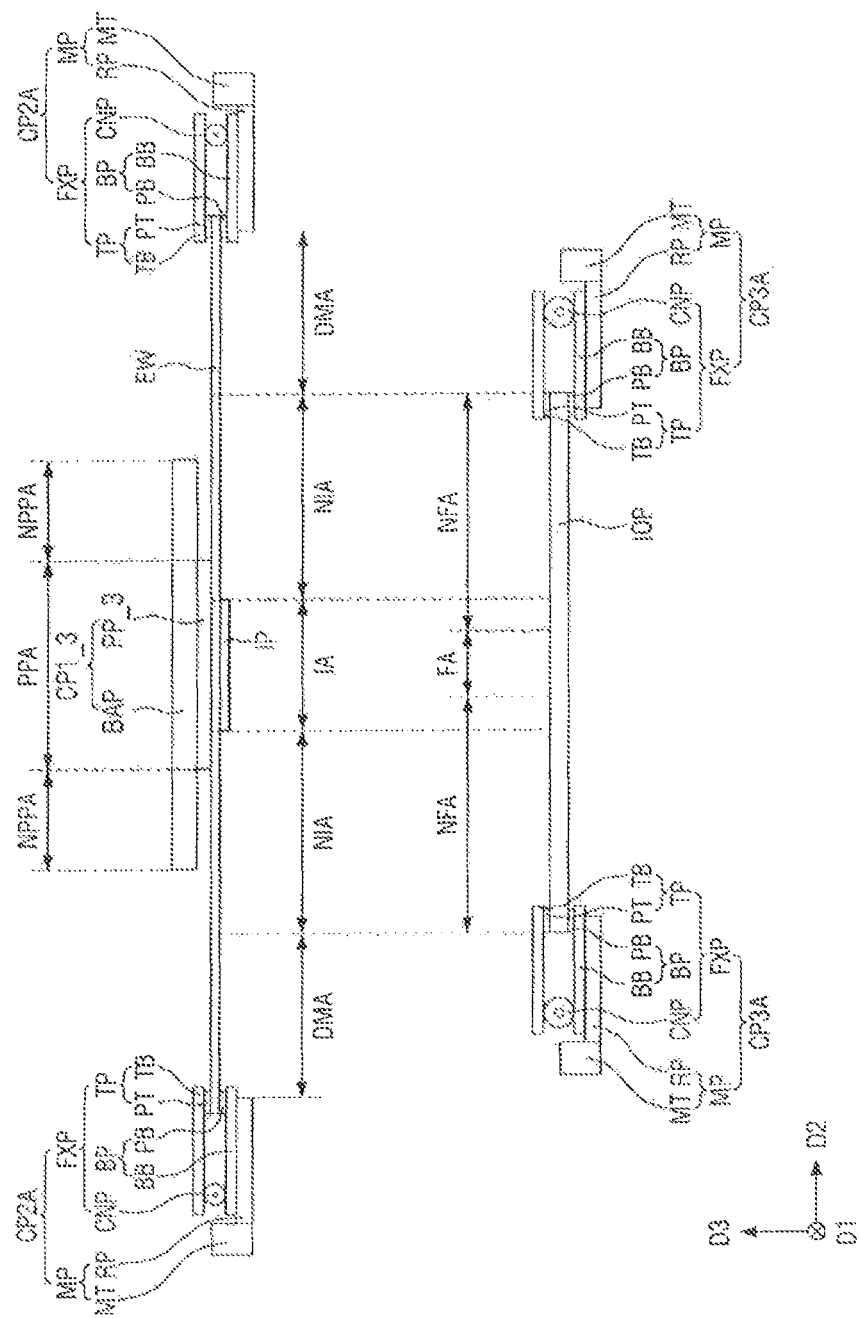
FIG. 22 is a schematic cross-sectional view illustrating an operation of placing a first shape changer on an inspection window in an adhesion defect detection method using an adhesion defect detection apparatus according to an exemplary embodiment of the present disclosure.
Figure 23:
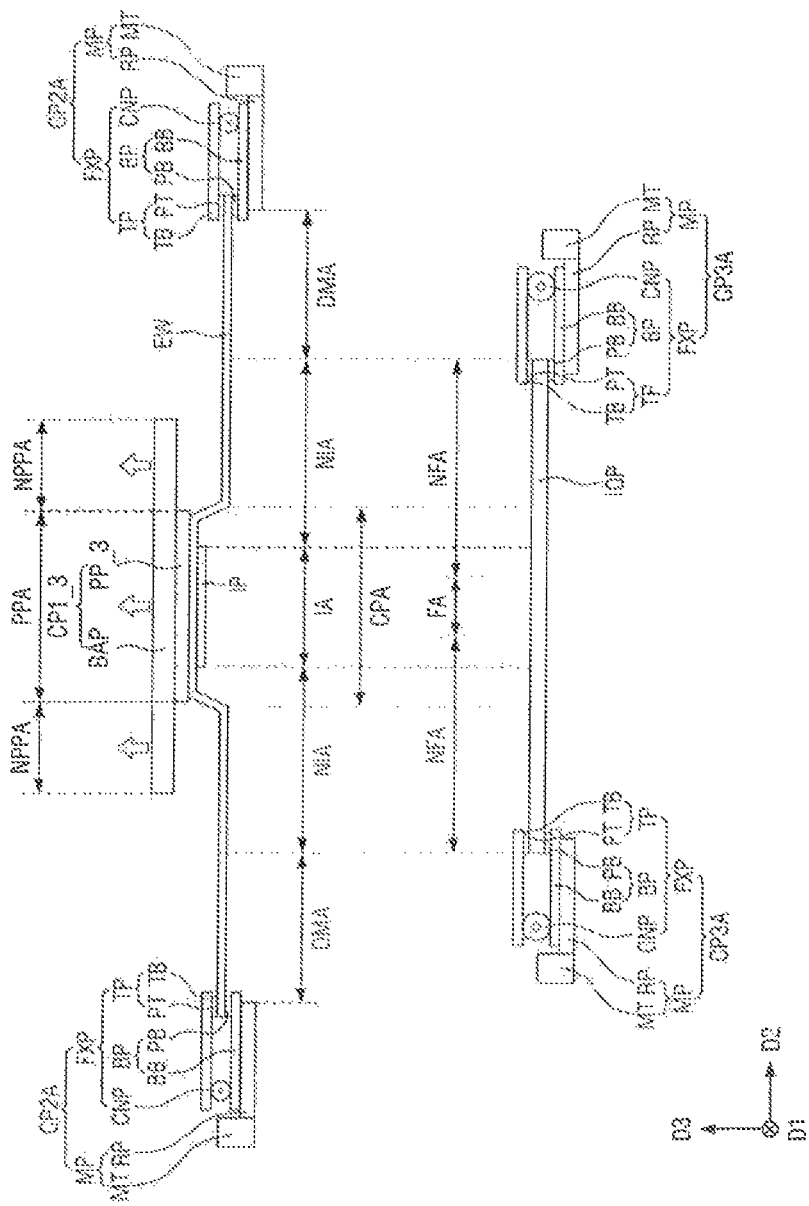
FIG. 23 is a schematic cross-sectional view illustrating an operation of changing the shape of the inspection window using the first shape changer in the adhesion defect detection method using the adhesion defect detection apparatus according to an exemplary embodiment of the present disclosure.

FIG. 22 is a schematic cross-sectional view illustrating an operation of placing a first shape changer on an inspection window in an adhesion defect detection method using an adhesion defect detection apparatus according to an exemplary embodiment of the present disclosure. FIG. 23 is a schematic cross-sectional view illustrating an operation of changing the shape of the inspection window using the first shape changer in the adhesion defect detection method using the adhesion defect detection apparatus according to an exemplary embodiment of the present disclosure.

The approach of FIGS. 22 and 23 is different from the approach of FIGS. 19 through 21 in that the first shape changer includes an adhesive material. A description of elements and features identical to those of the approach of FIGS. 19 through 21 will be omitted, and differences will be mainly described. To the extent that details have been omitted, it may be understood that the elements whose details have been omitted are at least similar to corresponding elements that are described in detail herein.

Referring to FIG. 22, in a state where an inspection window EW is stretched, a first shape changer CP1_3 is placed on the inspection window EW. In some embodiments, the first shape changer CP1_3 sets an area corresponding to an inspection area IA of the inspection window EW as a pattern area PPA and sets an area other than the pattern area PPA as a non-pattern area NPPA, and a pattern PP_3 is placed in the pattern area PPA. A width of the pattern area PPA in the second direction D2 may be greater than a width of the inspection area IA of the inspection window EW. However, the present invention is not limited to this case. In some embodiments, the width of the pattern area PPA in the second direction D2 may be equal to the width of the inspection area IA of the inspection window EW.

A folding area FA of an inspection target panel IOP, an inspection adhesive IP, the inspection area IA of the inspection window EW and the pattern PP_3 of the first shape changer CP1_3 at least partially overlap each other in the third direction D3. The pattern PP_3 includes an adhesive material, and the first shape changer CP1_3 is attached and fixed to the inspection window EW by the pattern PP_3.

Referring to FIG. 23, in a state where the first shape changer CP1_3 is fixed to the inspection window EW by the pattern PP_3, the first shape changer CP1_3 moves in the third direction D3. The shape of the inspection window EW fixed to a second shape changer CP2 is changed in the third direction D3 by the movement of the first shape changer CP1_3. Here, the inspection adhesive IP disposed on a lower surface of the inspection window EW is also moved in the third direction D3.

Figure 24:
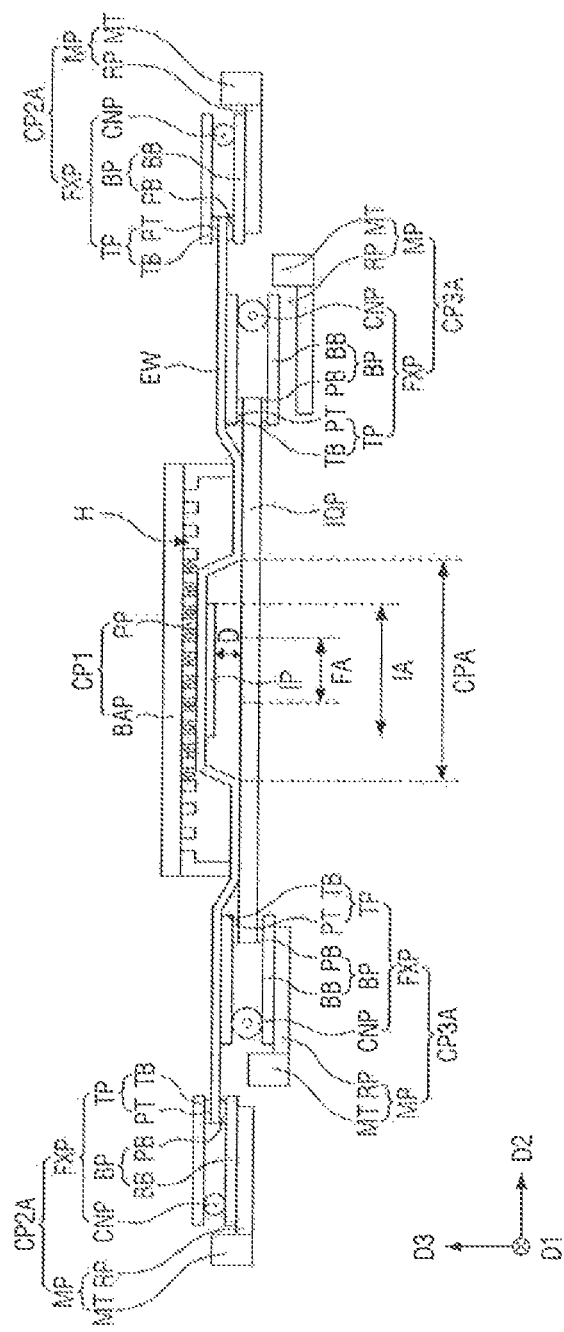
FIG. 24 is a schematic cross-sectional view illustrating an operation of bringing an inspection area of the inspection window close to a folding area of the inspection target panel in the adhesion defect detection method using the adhesion defect detection apparatus according to an exemplary embodiment of the present disclosure.
Figure 25:
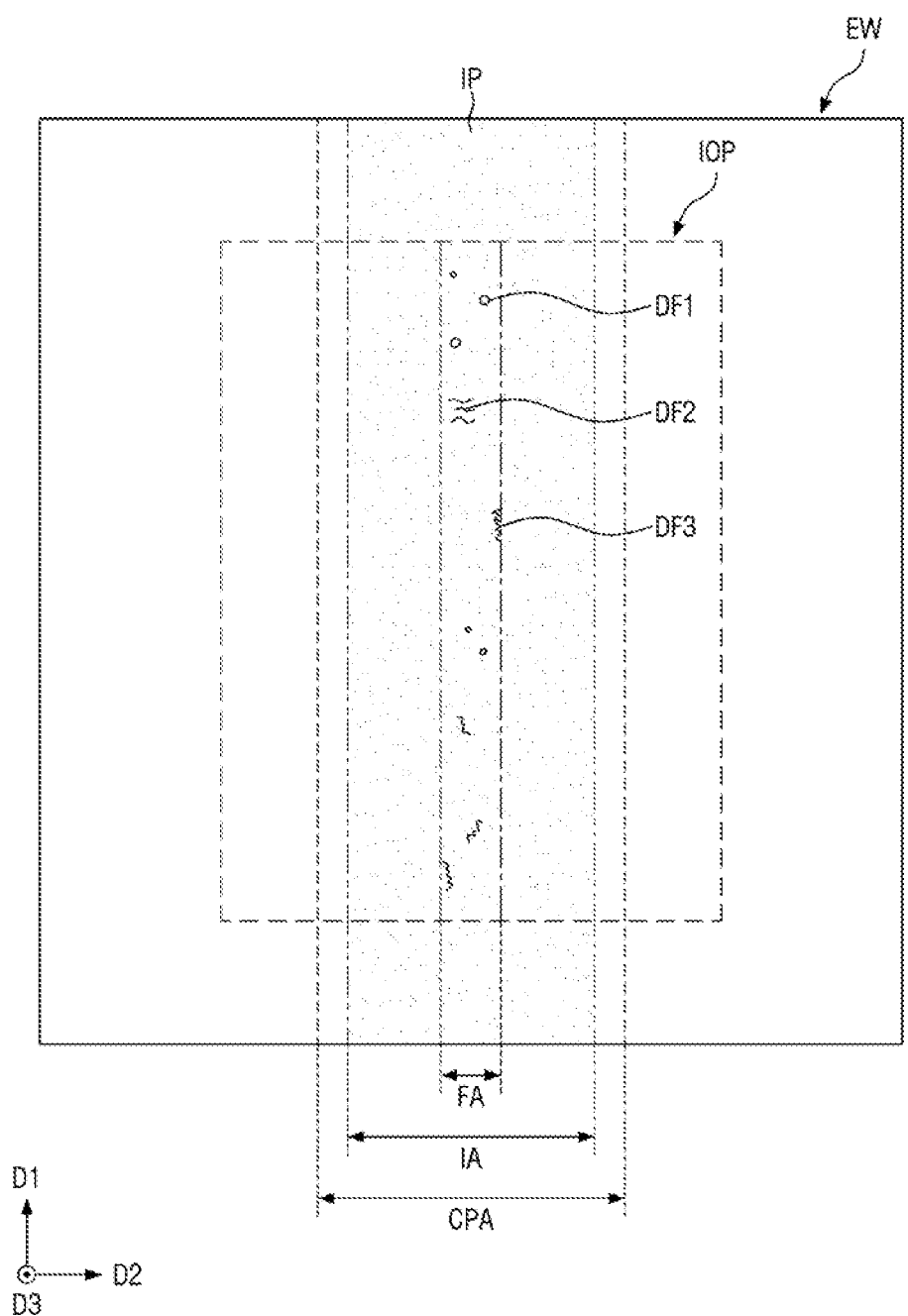
FIG. 25 is a schematic plan view illustrating an operation of inspecting the inspection target panel for the presence of adhesion defects by using the inspection window in the adhesion defect detection method using the adhesion defect detection apparatus according to an exemplary embodiment of the present disclosure.

FIG. 24 is a schematic cross-sectional view illustrating an operation of bringing an inspection area of the inspection window close to a folding area of the inspection target panel in the adhesion defect detection method using the adhesion defect detection apparatus according to an exemplary embodiment of the present disclosure. FIG. 25 is a schematic plan view illustrating an operation of inspecting the inspection target panel for the presence of adhesion defects by using the inspection window in the adhesion defect detection method using the adhesion defect detection apparatus according to an exemplary embodiment of the present disclosure.

Referring to FIG. 24, the second shape changer CP2 descends in the direction opposite to the third direction D3 to bring the inspection area IA of the inspection window EW close to the folding area FA of the inspection target panel IOP. Here, to prevent foreign matter from adhering to the inspection target panel IOP, the inspection adhesive IP disposed on a lower surface of the inspection area IA of the inspection window EW does not contact the inspection target panel IOP. A distance D between the inspection adhesive IP and the inspection target panel IOP in the third direction D3 may be 100 μm or more, preferably, 100 μm to 300 μm. This is because foreign matter can adhere to the inspection target panel IOP when the distance D is less than 100 μm, and the visibility of contact defects can be reduced when the distance D is more than 300 μm. However, the present invention is not limited to this case, and the distance D can also be more than 300 μm when equipment capable of precisely detecting contact defects is installed.

A portion of the inspection window EW may contact the inspection target panel IOP. However, since the inspection adhesive IP is not disposed on the portion of the inspection window EW which contacts the inspection target panel IOP, foreign matter might not adhere to the inspection target panel IOP. However, the present invention is not limited to this case. In some embodiments, the whole of the inspection window EW might not contact the inspection target panel IOP.

Referring to FIG. 25, when the folding area FA of the inspection target panel IOP, the inspection adhesive IP and the inspection window EW are brought close to each other without bonding, adhesion defects such as bubbles DF1, afterimages DF2 and edge blurring DF3 are observed in a manner similar to when the inspection target panel IOP and the inspection window EW are actually bonded together by the inspection adhesive IP. Accordingly, it is possible to determine whether the inspection target panel IOP is defective by detecting adhesion defects in advance without directly bonding a cover window to the inspection target panel IOP. Therefore, it is possible to prevent a situation where both the inspection target panel IOP and the cover window are discarded because defects are detected after the inspection target panel IOP and the cover window are bonded together.

Figure 26:
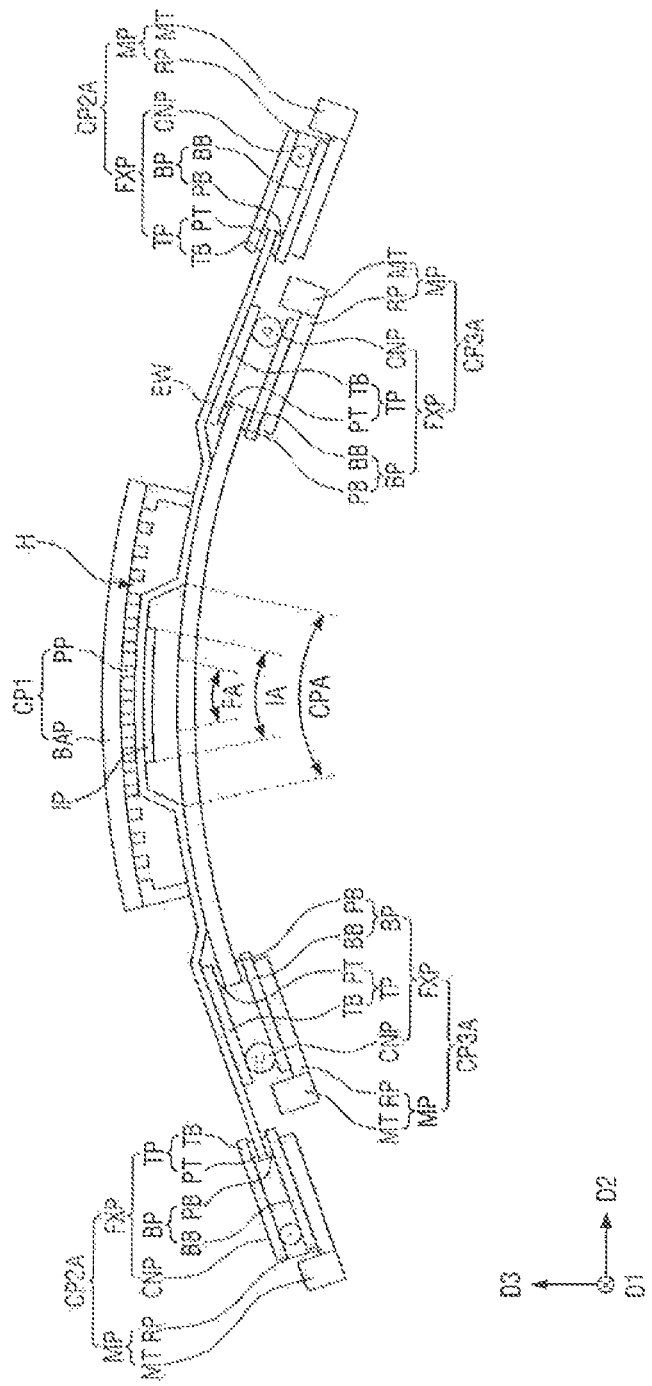
FIGS. 26 and 27 are schematic cross-sectional views illustrating an operation of inspecting the inspection target panel for the presence of adhesion defects by bending the inspection target panel and the inspection window in an adhesion defect detection method using an adhesion defect detection apparatus according to an exemplary embodiment of the present disclosure.
Figure 27:
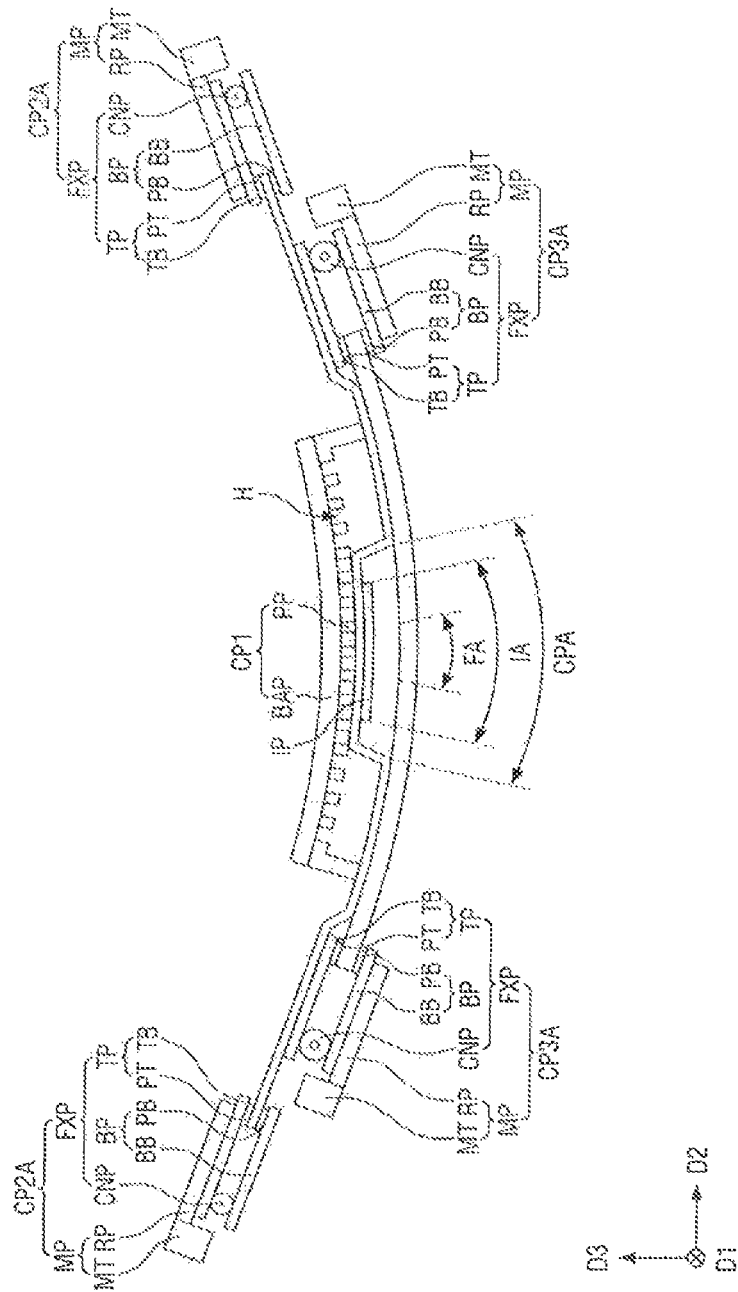

FIGS. 26 and 27 are schematic cross-sectional views illustrating an operation of inspecting the inspection target panel for the presence of adhesion defects by bending the inspection target panel and the inspection window in an adhesion defect detection method using an adhesion defect detection apparatus according to an exemplary embodiment of the present disclosure.

Referring to FIGS. 26 and 27, to detect adhesion defects at the time of folding, the inspection target panel IOP and the inspection window EW are bent using the second shape changer CP2 and the third shape changer CP3.

The non-folding area NFA of the inspection target panel IOP may be folded upward and downward from the folding area FA. Since adhesion defects can occur in a folding process or a bending process after the inspection target panel IOP is bonded to a cover window, the inspection target panel IOP and the inspection window EW are bent upward and downward from the folding area FA of the inspection target panel IOP by using the second shape changer CP2 and the third shape changer CP3. In addition, even in the bending process, a predetermined distance D is maintained between the inspection adhesive IP disposed on the lower surface of the inspection area IA of the inspection window EW and the inspection target panel IOP.

Figure 28:
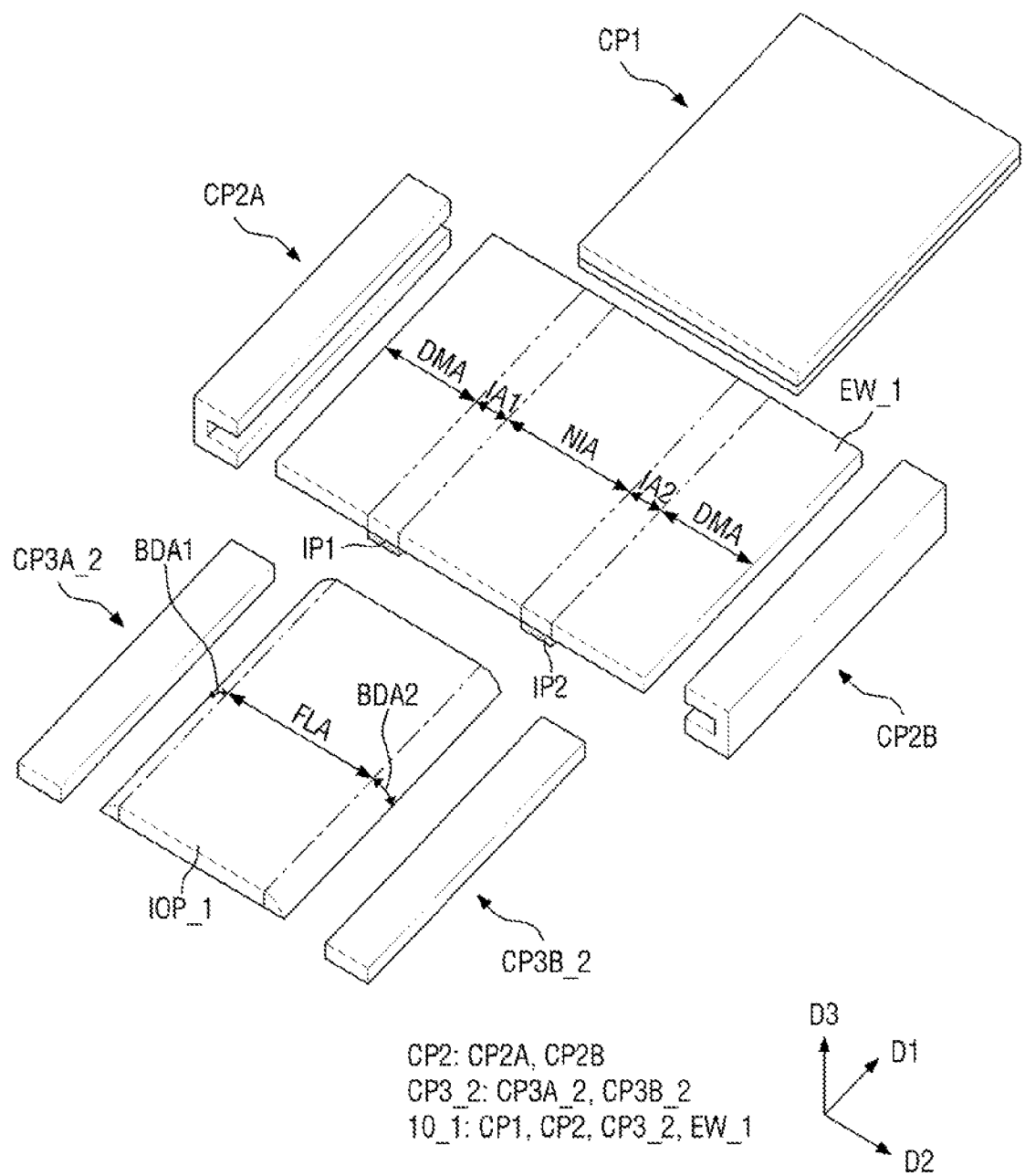
FIG. 28 is a schematic perspective view illustrating an adhesion defect detection apparatus according to an exemplary embodiment of the present disclosure.

When the inspection target panel IOP and the inspection window EW are bent upward and downward, adhesion defects are observed, like when the inspection target panel IOP and the inspection window EW are bonded together by the inspection adhesive IP. Through this bending process, adhesion defects that occur by the nature of a foldable display device can be additionally detected. However, the present invention is not limited to this case. In some embodiments, defects may be detected by changing the inspection target panel IOP and the inspection window EW into other shapes FIG. 28 is a schematic perspective view illustrating an adhesion defect detection apparatus 10_1 according to an exemplary embodiment of the present disclosure. FIG. 29 is a schematic cross-sectional view illustrating the adhesion defect detection apparatus 10_1 according to an exemplary embodiment of the present disclosure. The approach of FIGS. 28 and 29 is different from the approach of FIGS. 1 and 2 in that an inspection target panel IOP_1 has curved parts BDA1 and BDA2 and that inspection areas IA1 and IA2 of an inspection window EW_1 are disposed to correspond to the curved parts BDA1 and BDA2. A description of elements and features identical to those of the approach of FIGS. 1 and 2 will be omitted, and differences will be mainly described. To the extent that details have been omitted, it may be understood that the elements whose details have been omitted are at least similar to corresponding elements that are described in detail herein.

Referring to FIGS. 28 and 29, in some embodiments, the adhesion defect detection apparatus 10_1 may include the inspection window EW_1, a first shape changer CP1, a second shape changer CP2 and a third shape changer CP3_2.

The inspection target panel IOP_1 may include a flat part FLA and the curved parts BDA1 and BDA2 lying in different planes. The curved parts BDA1 and BDA2 may be connected to the flat part FLA and may be bent or curved from the flat part FLA. Each of the curved parts BDA1 and BDA2 may have a curved surface having a predetermined crossing angle to the flat part FLA. The curved parts BDA1 and BDA2 of the inspection target panel IOP_1 may include a first curved part BDA1 and a second curved part BDA2 disposed on both long sides of the flat part FLA, respectively. However, the present invention is not limited to this case, and flat surfaces having a predetermined crossing angle to the flat part FLA may also be formed on both long sides of the flat part FLA, respectively.

The inspection window EW_1 may include a first inspection area IA1, a second inspection area IA2, a non-inspection area NIA and a dummy area DMA. The first inspection area IA1 may at least partially overlap the first curved part BDA1 of the inspection target panel IOP_1 in the third direction D3, the second inspection area IA2 may at least partially overlap the second curved part BDA2 of the inspection target panel IOP_1 in the third direction D3, and the non-inspection area NIA may at least partially overlap the flat part FLA of the inspection target panel IOP_1 in the third direction D3.

In some embodiments, a width of the first inspection area IA1 of the inspection window EW_1 in the second direction D2 may be greater than a width of the first curved part BDA1 of the inspection target panel IOP_1 in the second direction D2, a width of the second inspection area IA2 of the inspection window EW_1 in the second direction D2 may be greater than a width of the second curved part BDA2 of the inspection target panel IOP_1 in the second direction D2, and a width of the non-inspection area NIA of the inspection window EW_1 in the second direction D2 may be smaller than a width of the flat part FLA of the inspection target panel IOP_1 in the second direction D2. In some embodiments, the width of the first inspection area IA1 of the inspection window EW_1 in the second direction D2 may be equal to the width of the first curved part BDA1 of the inspection target panel IOP_1 in the second direction D2, the width of the second inspection area IA2 of the inspection window EW_1 in the second direction D2 may be equal to the width of the second curved part BDA2 of the inspection window EW_1 in the second direction D2, and the width of the non-inspection area NIA of the inspection window EW_1 in the second direction D2 may be equal to the width of the flat part FLA of the inspection target panel IOP_1 in the second direction D2.

The dummy area DMA of the inspection window EW_1 might not overlap the inspection target panel IOP_1 in the third direction D3. However, the present invention is not limited to this case. In some embodiments, the dummy area DMA of the inspection window EW_1 may partially overlap the inspection target panel IOP_1 in the third direction D3.

A first inspection adhesive IP1 and a second inspection adhesive IP2 may be disposed on a lower surface of the inspection window EW_1. In some embodiments, the first inspection adhesive IP1 may at least partially overlap the first inspection area IA1 of the inspection window EW_1 in the third direction D3, and the second inspection adhesive P2 may at least partially overlap the second inspection area IA2 of the inspection window EW_1 in the third direction D3.

In some embodiments, the first inspection adhesive IP1 and the second inspection adhesive IP2 may at least partially overlap the first inspection area IA1, the second inspection area IA2 and a portion of the non-inspection area NIA of the inspection window EW_1. In addition, in some embodiments, the first inspection adhesive IP1 and the second inspection adhesive IP2 may at least partially overlap the first inspection area IA1, the second inspection area IA2, a portion of the non-inspection area NIA and a portion of the dummy area DMA of the inspection window EW_1 in the third direction D3.

The first shape changer CP1 may be disposed on the inspection window EW_1. The second shape changer C2 may be disposed parallel to the inspection window EW_1 in the second direction D2. The configurations of the first shape changer CP1 and the second shape changer CP2 is the same as those of the approach of FIGS. 1 and 2, and thus a detailed description thereof is omitted. To the extent that details have been omitted, it may be understood that the elements whose details have been omitted are at least similar to corresponding elements that are described in detail herein.

The third shape changer CP3_2 may include a first attachment group CP3A_2 and a second attachment group CP3B_2. The first attachment group CP3A_2 and the second attachment group CP3B_2 of the third shape changer CP3_2 may face each other with the inspection target panel IOP_1 interposed between them in the second direction D2.

Each of the first attachment group CP3A_2 and the second attachment group CP3B_2 may include a fixer FXP which fixes the dummy area DMA of the inspection window EW_1 and a actuator MP which moves the fixer FXP in the second direction D2 and the direction opposite to the second direction D2.

The fixer FXP may include a base B and a pad P disposed on an upper surface of the base B. The pad P may be made of a porous vacuum pad. The pad P may suck or release a lower surface of the inspection target panel IOP_1 according to air sucked into or expelled from the base B. In some embodiments, the pad P may be made of an adhesive material. In this case, the fixer FXP may fix the inspection target panel IOP_1 using the adhesive properties of the pad P.

FIG. 30 is a schematic cross-sectional view illustrating an adhesion defect detection apparatus according to an exemplary embodiment of the present disclosure.

Referring to FIG. 30, in some embodiments, a plurality of first shape changers CP1A and CP1B may be disposed to correspond to a plurality of inspection areas IA1 and IA2. For example, a first shape changer CP1_4 may include a $(1\_1)^{th}$ shape changer CP1A and a $(1\_2)^{th}$ shape changer CP1B spaced apart from each other.

The $(1\_1)^{th}$ shape changer CP1A may include a first base BAP1 and a first pattern PP1, and the first pattern PP1 may include a plurality of holes H. The $(1\_2)^{th}$ shape changer CP1B may include a second base BAP2 and a second pattern PP2, and the second pattern PP2 may include a plurality of holes H.

The $(1\_1)^{th}$ shape changer CP1A may be disposed on a first inspection area IA1 of an inspection window EW_1 to at least partially overlap a first inspection adhesive IP1 and a first curved BDA1 in the third direction D3. The $(1\_2)^{th}$ shape changer CP1B may be disposed on a second inspection area IA2 of the inspection window EW_1 to at least partially overlap a second inspection adhesive IP2 and a second curved part BDA2 in the third direction D3. When a plurality of first shape changers CP1A and CP1B are disposed to correspond to a plurality of inspection areas IA1 and IA2 as described above, they can be placed according to various shapes of an inspection target panel IOP_1.

An adhesion defect detection method using an adhesion defect detection apparatus according to an exemplary embodiment of the present disclosure will now be described with reference to FIGS. 31 through 41. The approach of FIGS. 31 through 41 is different from the approach of the detection method of FIGS. 12 through 27 in that an inspection target panel has curved parts and that inspection areas of an inspection window are placed to correspond to the curved parts. A description of elements and features identical to those of the approach of FIGS. 12 and 27 will be omitted, and differences will be mainly described. To the extent that details have been omitted, it may be understood that the elements whose details have been omitted are at least similar to corresponding elements that are described in detail herein.

Figure 31:
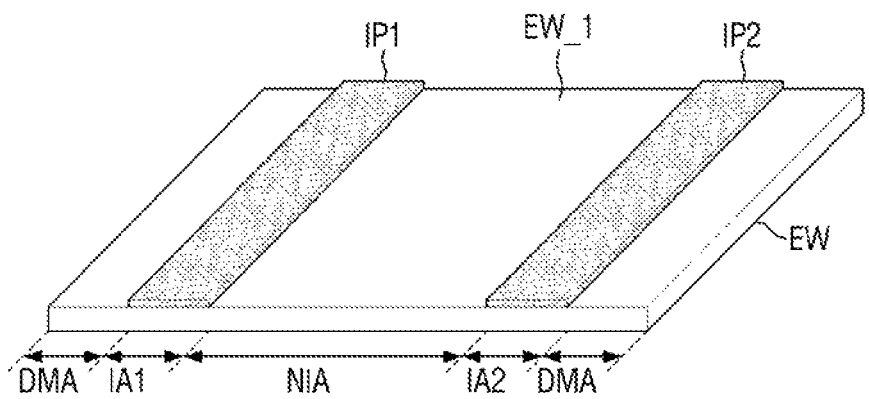
FIG. 31 is a schematic perspective view illustrating an operation of placing inspection adhesives on an inspection window in an adhesion defect detection method using an adhesion defect detection apparatus according to an exemplary embodiment of the present disclosure.

FIG. 31 is a schematic perspective view illustrating an operation of placing inspection adhesive on an inspection window in an adhesion defect detection method using an adhesion defect detection apparatus according to an exemplary embodiment of the present disclosure.

Referring to FIG. 31, a first inspection adhesive IP1 and a second inspection adhesive IP2 are placed on a surface of an inspection window EW_1. As described above, the first inspection adhesive IP1 is placed to at least partially overlap a first inspection area IA1 of the inspection window EW_1 in the third direction D3, and the second in section adhesive IP2 is placed to at least partially overlap a second inspection area IA2 of the inspection window EW_1 in the third direction D3.

Figure 32:
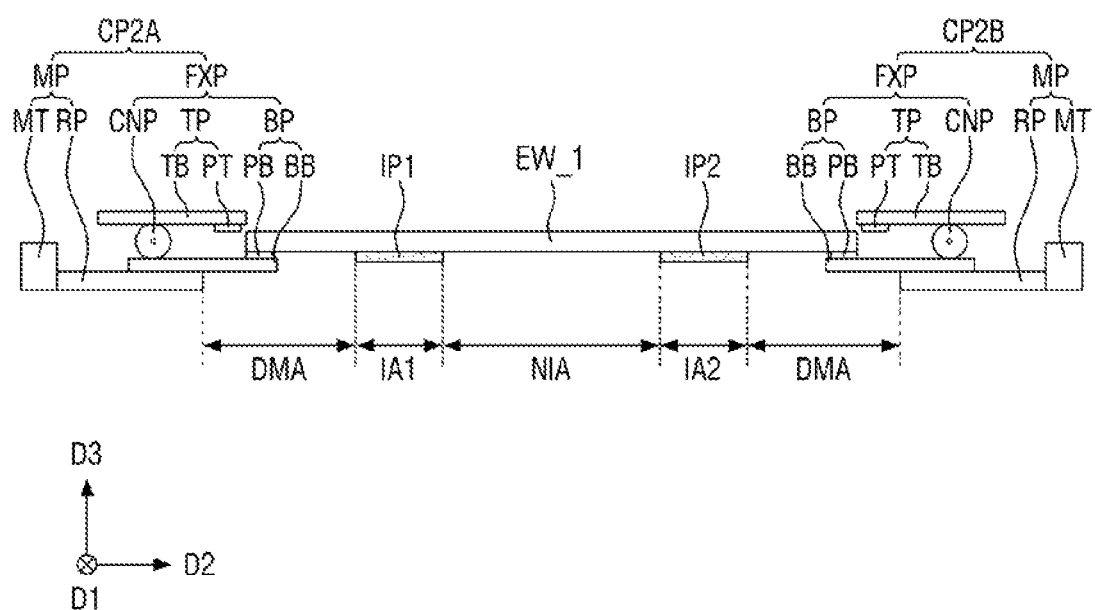
FIG. 32 is a schematic cross-sectional view illustrating an operation of placing the inspection window on a second shape changer in the adhesion defect detection method using the adhesion defect detection apparatus according to an exemplary embodiment of the present disclosure.
Figure 33:
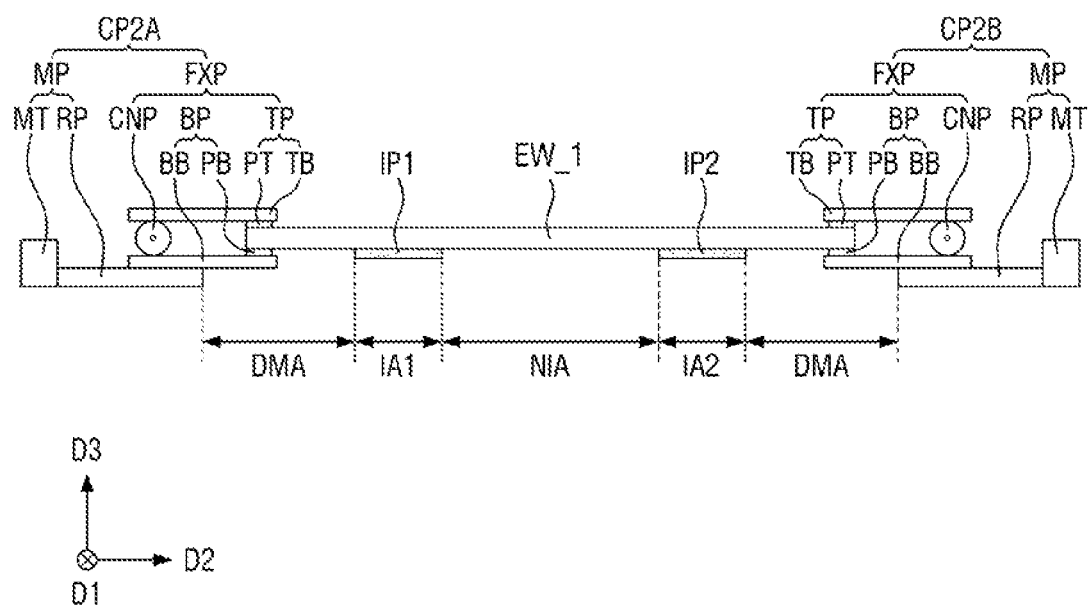
FIG. 33 is a schematic cross-sectional view illustrating an operation of fixing the inspection window using the second shape changer in the adhesion defect detection method using the adhesion defect detection apparatus according to an exemplary embodiment of the present disclosure.

FIG. 32 is a schematic cross-sectional view illustrating an operation of placing the inspection window on a second shape changer in the adhesion defect detection method using the adhesion defect detection apparatus according to an exemplary embodiment of the present disclosure. FIG. 33 is a schematic cross-sectional view illustrating an operation of fixing the inspection window using the second shape changer in the adhesion defect detection method using the adhesion defect detection apparatus according to an exemplary embodiment of the present disclosure. The approach of FIGS. 32 and 33 is substantially the same as the approach of FIGS. 13 and 14, and thus a detailed description thereof is omitted. To the extent that details have been omitted, it may be understood that the elements whose details have been omitted are at least similar to corresponding elements that are described in detail herein.

FIG. 34 is a schematic cross-sectional view illustrating an operation of placing and fixing an inspection target panel on a third shape changer in the adhesion defect detection method using the adhesion defect detection apparatus according to an exemplary embodiment of the present disclosure.

Referring to FIG. 34, an inspection target panel IOP_1 is placed on a third shape changer CP3_2. For example, the inspection target panel IOP_1 is placed on a fixer FXP of each of a first attachment group CP3A_2 and a second attachment group CP3B_2 such that a surface to which a cover window is attached faces upward.

An area of the inspection target panel IOP_1 which is placed on the fixer FXP of each of the first attachment group CP3A_2 and the second attachment group CP3B_2 may be a lower surface of each of a first curved part BDA1 and a second curved part BDA2 of the inspection target panel IOP_1. However, the present invention is not limited to this case. In some embodiments, the area of the inspection target panel IOP_1 which is placed on the fixer FXP of each of the first attachment group CP3A_2 and the second attachment group CP3B_2 may extend to a flat part FLA of the inspection target panel OP_1 or may be limited to a portion of the lower surface of each of the first curved part BDA1 and the second curved part BDA2 of the inspection target panel IOP_1.

The inspection target panel IOP_1 placed on the fixer FXP of each of the first attachment group CP3A_2 and the second attachment group CP3B_2 is fixed by a pad P of the fixer FXP.

FIG. 35 is a schematic cross-sectional view illustrating an operation of aligning the inspection window and the inspection target panel in the adhesion defect detection method using the adhesion defect detection apparatus according to an exemplary embodiment of the present disclosure.

Referring to FIG. 35, the inspection window EW_1 and the inspection target panel IOP_1 are aligned to at least partially overlap each other in the third direction D3. For example, the inspection target panel IOP_1 is fixed by the third shape changer CP3_2, and the inspection window EW_1 fixed by a second shape changer CP2 is placed on the fixed inspection target panel IOP_1. Here, the first inspection adhesive IP1 and the second inspection adhesive IP2 of the inspection window EW_1 are placed to face an upper surface of the inspection target panel IOP_1.

The first inspection area IA1 of the inspection window EW_1, the first inspection adhesive IP1 and the first curved part BDA1 of the inspection target panel IOP_1 at least partially overlap each other in the third direction D3, and the second inspection area IA2 of the inspection window EW_1, the second inspection adhesive IP2 and the second curved part BDA2 of the inspection target panel IOP_1 at least partially overlap each other in the third direction D3.

Figure 36:
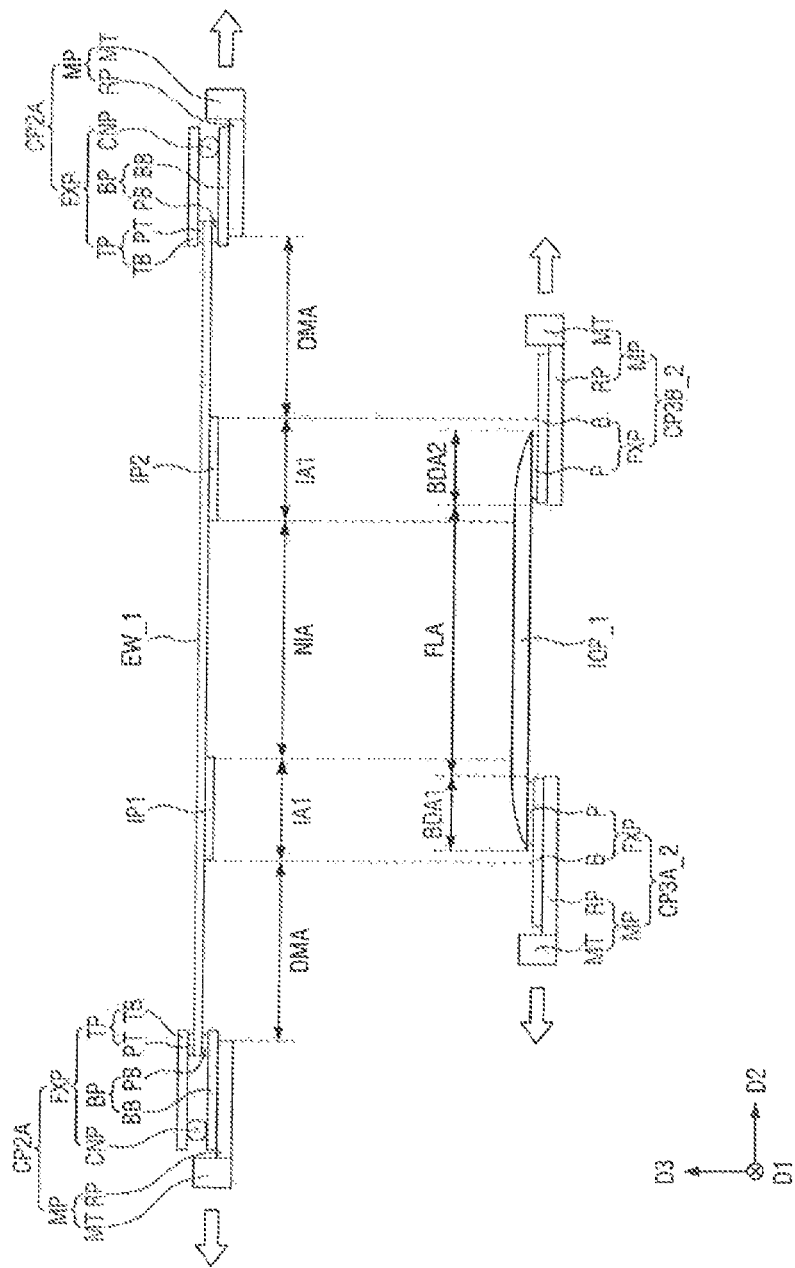
FIG. 36 is a schematic cross-sectional view illustrating an operation of stretching the inspection window and the inspection target panel in the adhesion defect detection method using the adhesion defect detection apparatus according to an exemplary embodiment of the present disclosure.

FIG. 36 is a schematic cross-sectional view illustrating an operation of stretching the inspection window and the inspection target panel in the adhesion defect detection method using the adhesion defect detection apparatus according to an exemplary embodiment of the present disclosure.

In a state where the inspection window EW_1 and the inspection target panel IOP_1 are aligned with each other, to increase the overall uniformity of the inspection window EW_1, a first attachment group CP2A of the second shape changer CP2 moves in the direction opposite to the second direction D2, and a second attachment group CP2B of the second shape changer CP2 moves in the second direction D2 to stretch the inspection window EW_1 in the second direction D2 and the direction opposite to the second direction D2.

In addition, to increase the overall uniformity of the inspection target panel OP_1, the first attachment group CP3A_2 of the third shape changer CP3_2 moves in the direction opposite to the second direction D2, and the second attachment group CP3B_2 of the third shape changer CP3_2 moves in the second direction D2 to stretch the inspection target panel IOP_1 in the second direction D2 and the direction opposite to the second direction D2.

Figure 37:
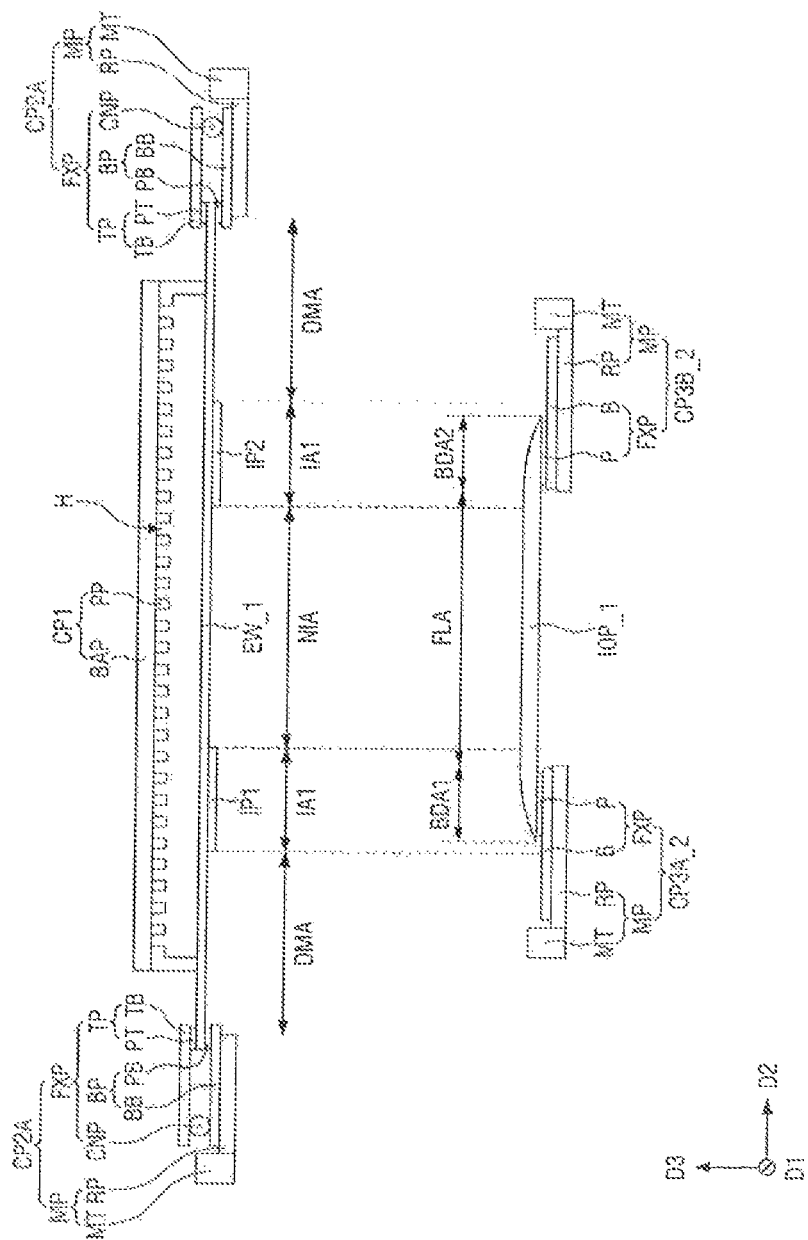
FIG. 37 is a schematic cross-sectional view illustrating an operation of placing a first shape changer on the inspection window in the adhesion defect detection method using the adhesion defect detection apparatus according to an exemplary embodiment of the present disclosure.

FIG. 37 is a schematic cross-sectional view illustrating an operation of placing a first shape changer on the inspection window in the adhesion defect detection method using the adhesion defect detection apparatus according to an exemplary embodiment of the present disclosure.

In a state where the inspection window EW_1 is stretched, a first shape changer CP1 is placed on the inspection window EW_1. The first shape changer CP1 has a smaller width than the inspection window EW_1 in the second direction D2 but at least partially overlaps the first inspection area IA1 and the second inspection area IA2 of the inspection window EW_1. Accordingly, the first curved part BDA1 of the inspection target panel IOP_1, the first inspection adhesive IP1, the first inspection area IA1 of the inspection window EW_1 and the first shape changer CP1 at least partially overlap each other in the third direction D3, and the second curved part BDA2 of the inspection target panel IOP_1, the second inspection adhesive IP2, the second inspection area IA2 of the inspection window EW_1 and the first shape changer CP1 at least partially overlap each other in the third direction D3.

Figure 38:
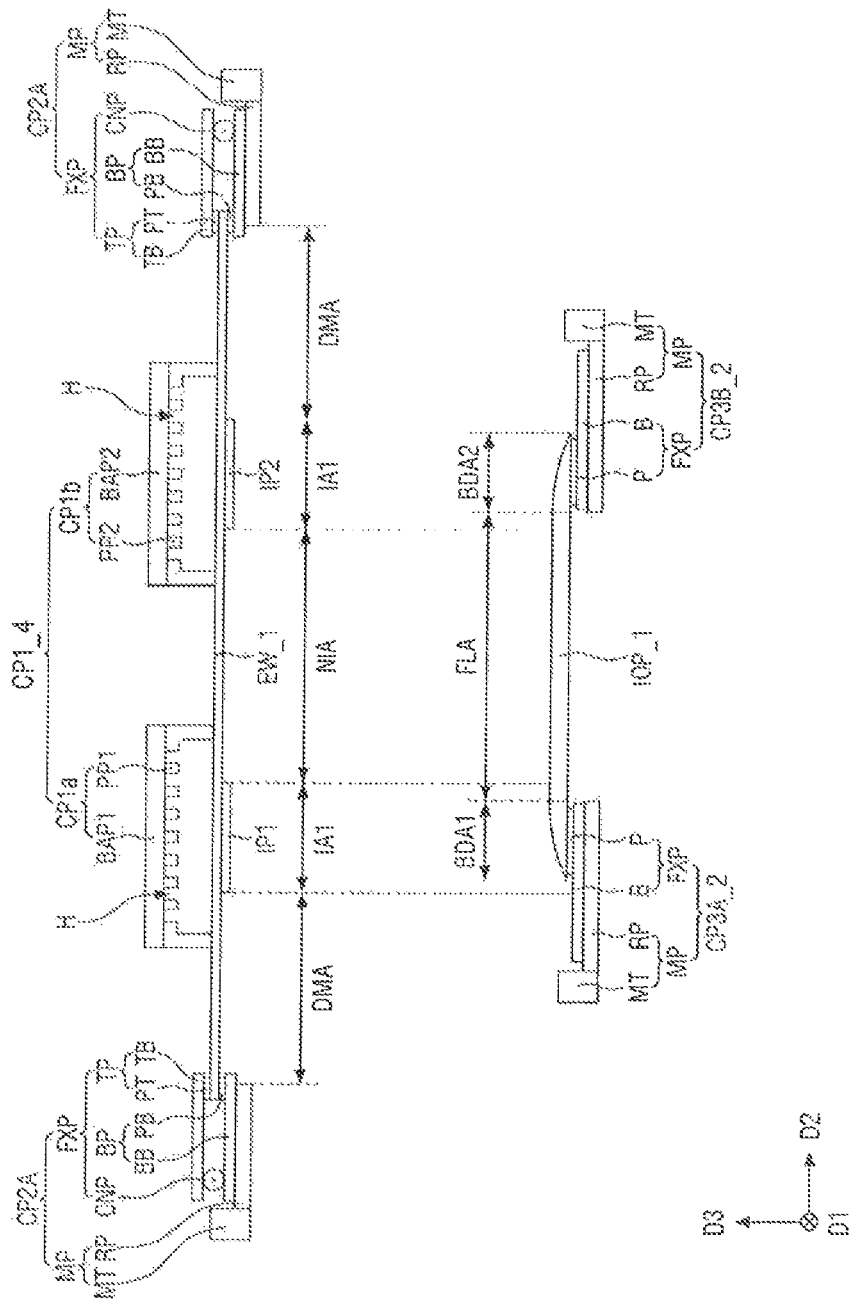
FIG. 38 is a schematic cross-sectional view illustrating an operation of placing a first shape changer on an inspection window in an adhesion defect detection method using an adhesion defect detection apparatus according to an exemplary embodiment of the present disclosure.

FIG. 38 is a schematic cross-sectional view illustrating an operation of placing a first shape changer on an inspection window in an adhesion defect detection method using an adhesion defect detection apparatus according to an exemplary embodiment of the present disclosure.

Referring to FIG. 38, in some embodiments, a first shape changer CP1_4 includes a $(1\_1)^{th}$ shape changer CP1A and a $(1\_2)^{th}$ shape changer CP1B spaced apart from each other. The $(1\_1)^{th}$ shape changer CP1A is placed on a first inspection area IA1 of an inspection window EW_1 to at least partially overlap a first inspection adhesive IP1 and a first curved part BDA1 in the third direction D3. In addition, the $(1\_2)^{th}$ shape changer CP1B is placed on a second inspection area IA2 of the inspection window EW_1 to at least partially overlap a second inspection adhesive IP2 and a second curved part BDA2 in the third direction D3.

Figure 39:
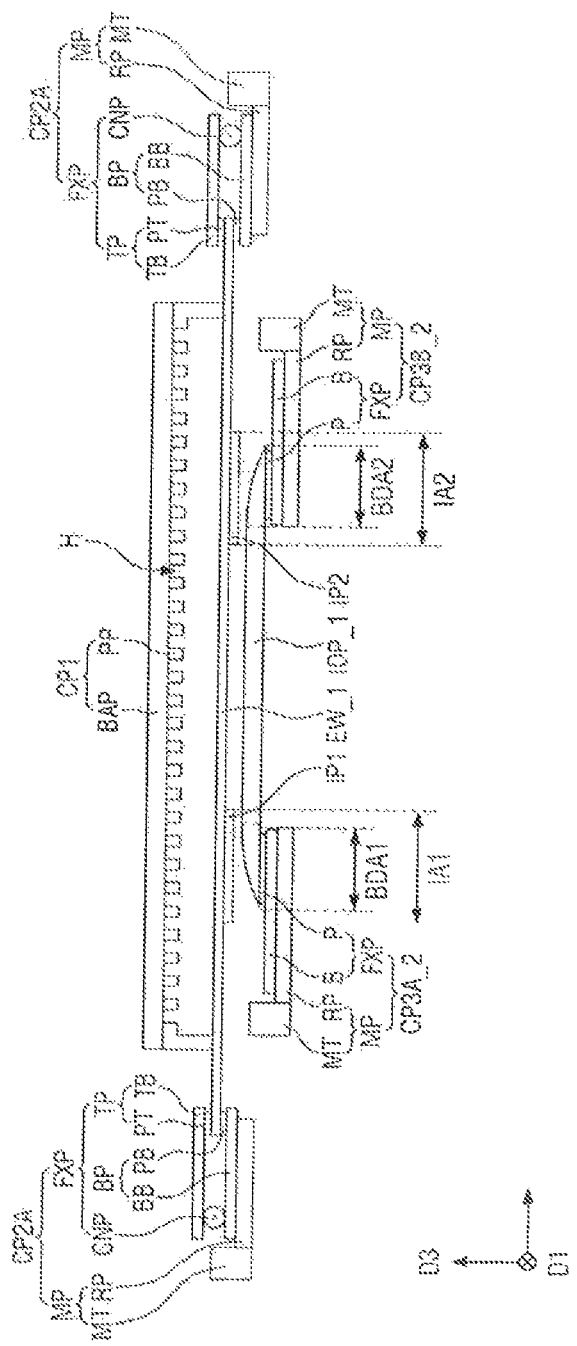
FIG. 39 is a schematic cross-sectional view illustrating an operation of bringing inspection areas of the inspection window close to curved parts of the inspection target panel in the adhesion defect detection method using the adhesion defect detection apparatus according to an exemplary embodiment of the present disclosure.

FIG. 39 is a schematic cross-sectional view illustrating an operation of bringing inspection areas of the inspection window close to curved parts of the inspection target panel in the adhesion defect detection method using the adhesion defect detection apparatus according to an exemplary embodiment of the present disclosure.

Referring to FIG. 39, the second shape changer CP2 descends in the direction opposite to the third direction D3 to bring the first inspection area IA1 and the second inspection area IA2 of the inspection window EW_1 close to the first curved part BDA1 and the second curved part BDA2 of the inspection target panel IOP_1. Here to prevent foreign matter from adhering to the inspection target panel IOP_1, the first inspection adhesive IP1 and the second inspection adhesive IP2 respectively disposed on lower surfaces of the first inspection area IA1 and the second inspection area IA2 of the inspection window EW_1 do not contact the inspection target panel IOP_1. A distance D between each of the first inspection adhesive IP1 and the second inspection adhesive IP2 and the flat part FLA of the inspection target panel IOP_1 in the third direction D3 may be 100 μm or more, preferably, 100 μm to 300 μm. This is because foreign matter can adhere to the inspection target panel IOP_1 when the distance D is less than 100 μm, and the visibility of contact defects can be reduced when the distance D is more than 300 μm. However, the present invention is not limited to this case, and the distance D can also be more than 300 μm when equipment capable of precisely detecting contact defects is installed.

Figure 40:
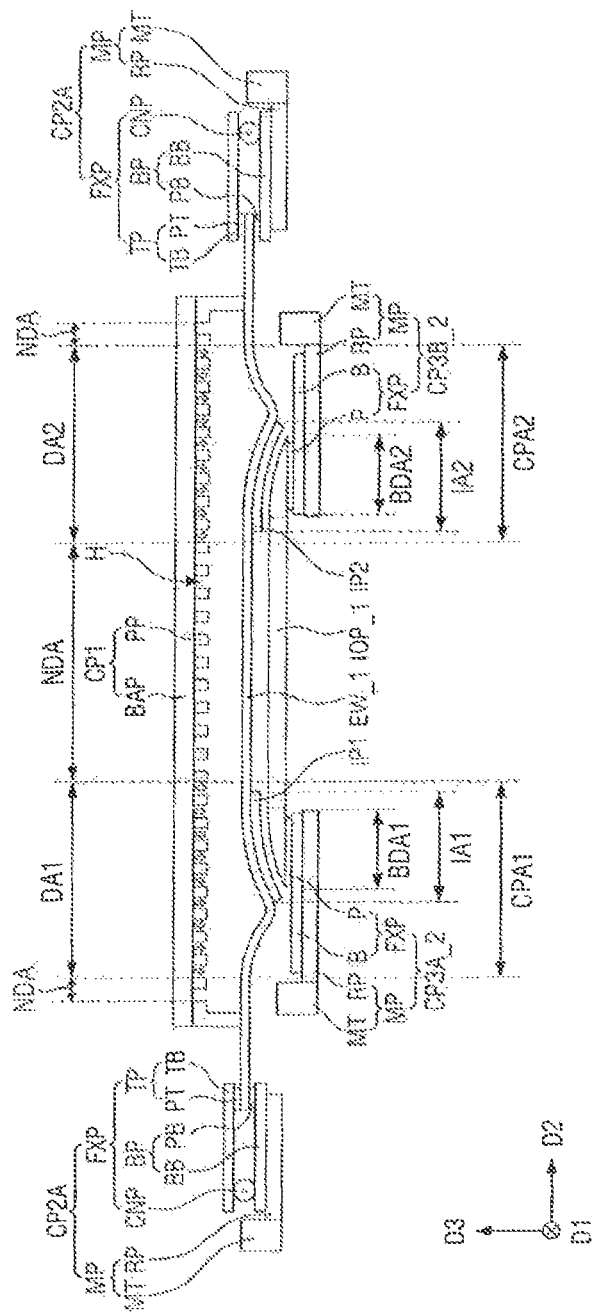
FIG. 40 is a schematic cross-sectional view illustrating an operation of changing the shape of the inspection window using the first shape changer in the adhesion defect detection method using the adhesion defect detection apparatus according to an exemplary embodiment of the present disclosure.
Figure 41:
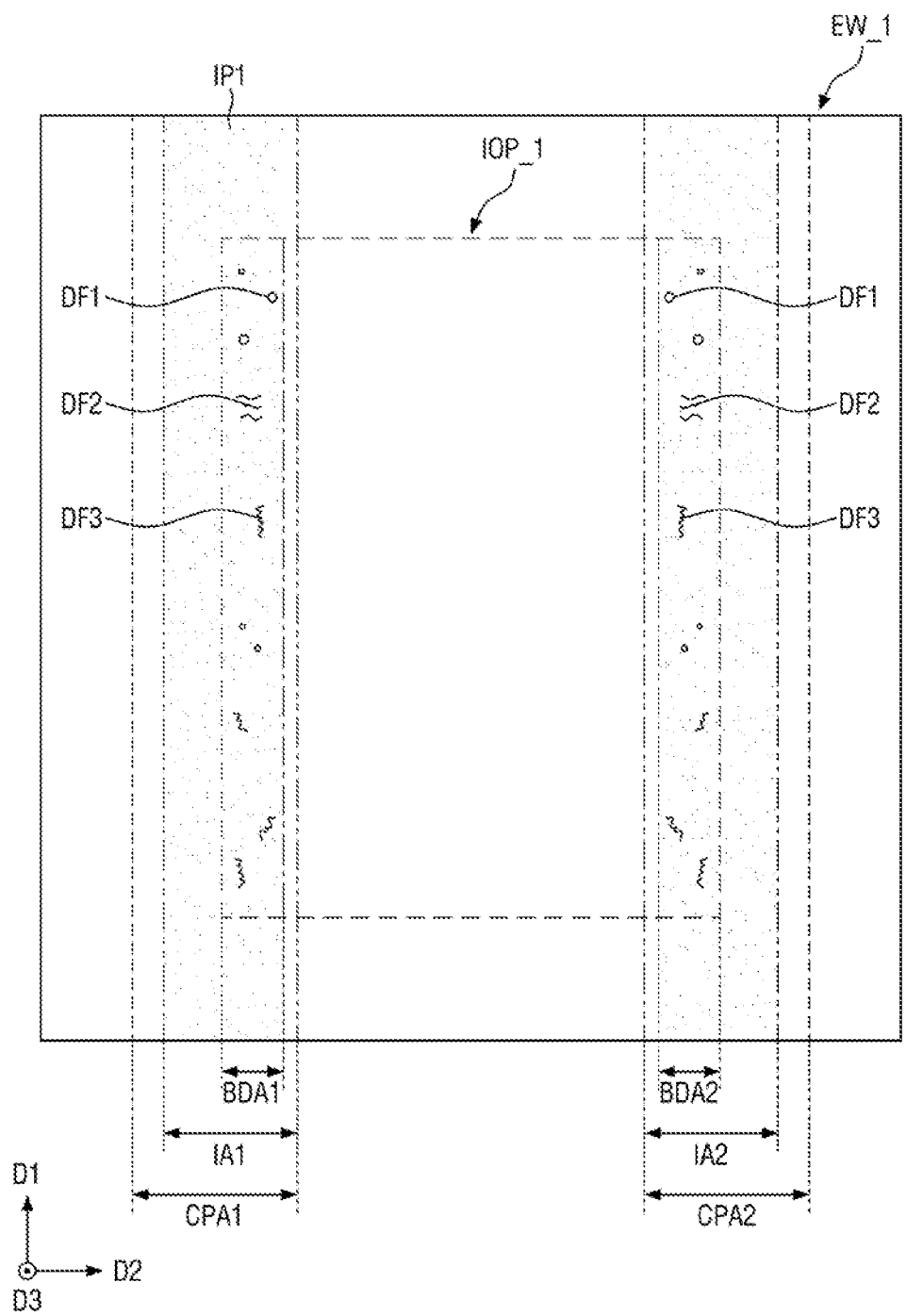
FIG. 41 is a schematic plan view illustrating an operation of inspecting the inspection target panel for the presence of adhesion defects by using the inspection window in the adhesion defect detection method using the adhesion defect detection apparatus according to an exemplary embodiment of the present disclosure.

FIG. 40 is a schematic cross-sectional view illustrating an operation of changing the shape of the inspection window using the first shape changer in the adhesion defect detection method using the adhesion defect detection apparatus according to an exemplary embodiment of the present disclosure. FIG. 41 is a schematic plan view illustrating an operation of inspecting the inspection target panel for adhesion defects by using the inspection window in the adhesion defect detection method using the adhesion defect detection apparatus according to an exemplary embodiment of the present disclosure.

Referring to FIG. 40, the first shape changer CP1 includes a driving area DA and a non-driving area NDA, and the driving area DA include a first driving area DA1 and a second driving area DA2. The first driving area DA1 corresponds to the first inspection area IA1, and the second driving area DA2 corresponds to the second inspection area IA2.

A plurality of holes H of a pattern PP disposed in the driving area DA expel air EX according to the driving of the first shape changer CP1, and the shape of the inspection window EW_1 corresponding to the driving area DA is changed in the direction opposite to the third direction D3. Here, the first inspection adhesive IP1 and the second inspection adhesive IP2 disposed on a lower surface of the inspection window EW_1 are also moved in the direction opposite to the third direction D3.

In the inspection window EW_1, areas whose shapes are changed by the first shape changer CP1 are defined as a first shape change area CPA1 and a second shape change area CPA2. The first shape change area CPA1 of the inspection window EW_1 and the first inspection adhesive IP1 are changed in shape according to the shape of the first curved part BDA1, and the second shape change area CPA2 of the inspection window EW_1 and the second inspection adhesive 1P2 are changed in shape according to the shape of the second curved part BDA2. In addition, the first inspection adhesive IP1 and the second adhesive IP2 do not contact the inspection target panel IOP_1. For example, the distance D between each of the first inspection adhesive IP1 and the second inspection adhesive IP2 and the inspection target panel IOP_1 may be 100 µm or more, preferably, 100 µm to 300 µm. This is because foreign matter can adhere to the inspection target panel IOP_1 when the distance D is less than 100 µm, and the visibility of contact defects can be reduced when the distance D is more than 300 µm. However, the present invention is not limited to this case, and the distance D can also be more than 300 µm when equipment capable of precisely detecting contact defects is installed.

Referring to FIG. 41, when the inspection window EW_1 having the first inspection adhesive IP1 and the second inspection adhesive IP2 is brought close to the first curved part BDA1 and the second curved part BDA2 of the inspection target panel IOP_1, adhesion defects such as bubbles DF1, afterimages DF2 and edge blurring DF3 are observed, like when the inspection target panel IOP_1 and the inspection window EW_1 are bonded together by the first inspection adhesive IP1 and the second inspection adhesive IP2. Accordingly, it is possible to determine whether the inspection target panel IOP_1 is defective by detecting adhesion defects in advance without directly bonding the cover window to the inspection target panel IOP_1. Therefore, it is possible to prevent a situation where both the inspection target panel IOP_1 and the cover window are discarded because defects are detected after the inspection target panel IOP_1 and the cover window are bonded together.

Figure 42:
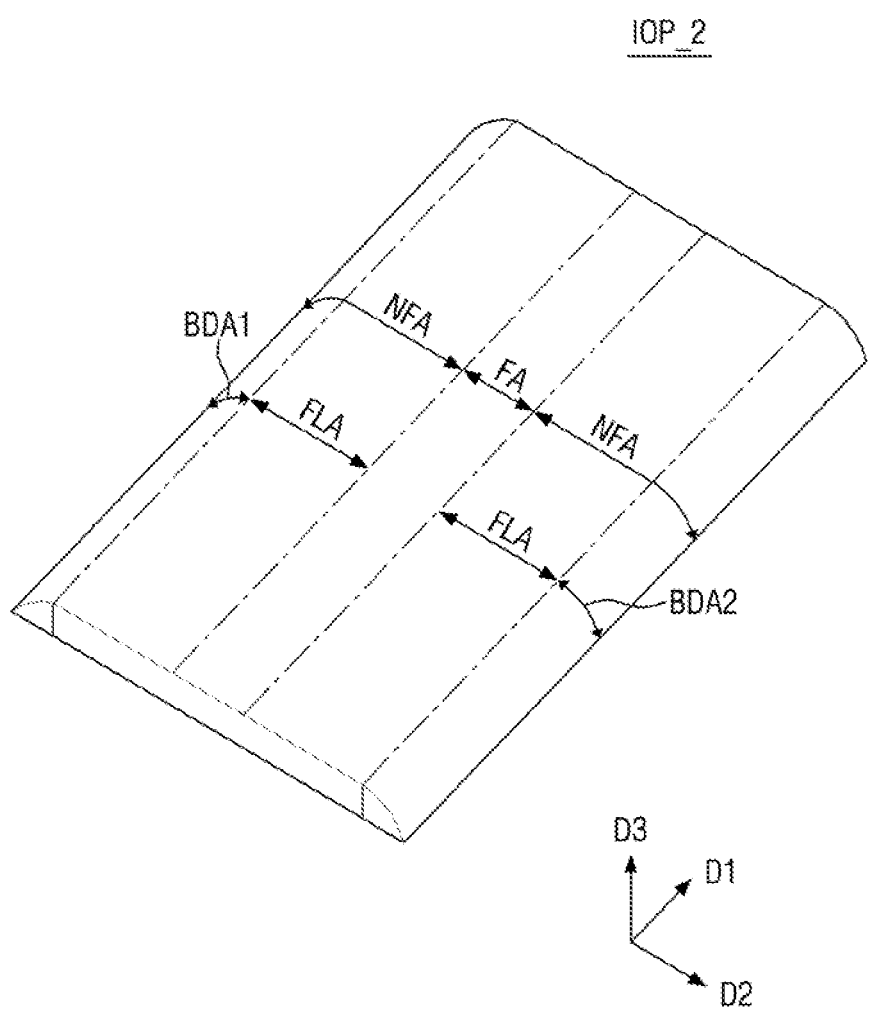
FIG. 42 is a schematic perspective view illustrating an inspection target panel according to an exemplary embodiment of the present disclosure.
Figure 43:
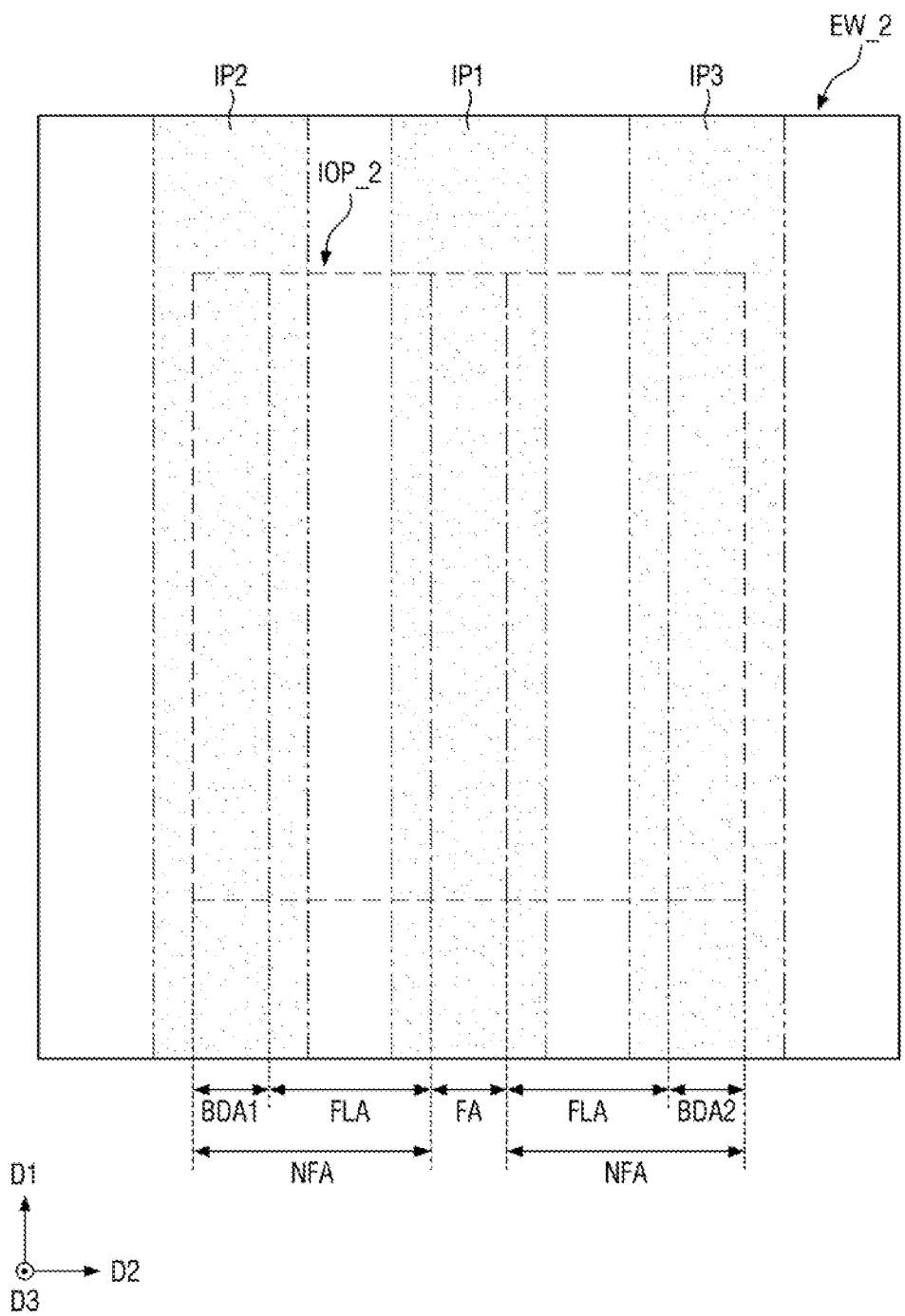
FIG. 43 is a schematic plan view illustrating an operation of inspecting the inspection target panel of FIG. 42 for the presence of adhesion defects by using an inspection window in an adhesion defect detection method using an adhesion defect detection apparatus according to an exemplary embodiment of the present disclosure.

FIG. 42 is a schematic perspective view illustrating an inspection target panel IOP_2 according to an exemplary embodiment of the present disclosure. FIG. 43 is a schematic plan view illustrating an operation of inspecting the inspection target panel IOP_2 of FIG. 42 for adhesion defects by using an inspection window in an adhesion defect detection method using an adhesion defect detection apparatus according to an exemplary embodiment of the present disclosure.

Referring to FIGS. 42 and 43, the inspection target panel IOP. 2 may include a folding area FA and a non-folding area NFA, and the non-folding area NFA may include a flat part FLA and a first curved part BDA1 and a second curved part BDA2 disposed on both sides of the flat part FLA.

On a lower surface of an inspection window EW_2, a first inspection adhesive IP1 is disposed to correspond to the folding area FA of the inspection target panel IOP_2, a second inspection adhesive IP2 is disposed to correspond to the first curved part BDA1 of the inspection target panel IOP_2, and a third inspection adhesive IP3 is disposed to correspond to the second curved part BDA2 of the inspection target panel IOP_2. According to the above-described detection method, an area of the inspection window EW_2 on which the first inspection adhesive IP1 is disposed is changed in shape in the third direction D3, areas of the inspection window EW_2 on which the second inspection adhesive IP2 and the third inspection adhesive IP3 are disposed are changed in shape in the direction opposite to the third direction D3, and these areas are brought close to the inspection target panel IOP_2 to detect adhesion defects of weak adhesion portions in advance of bonding.

Figure 44:
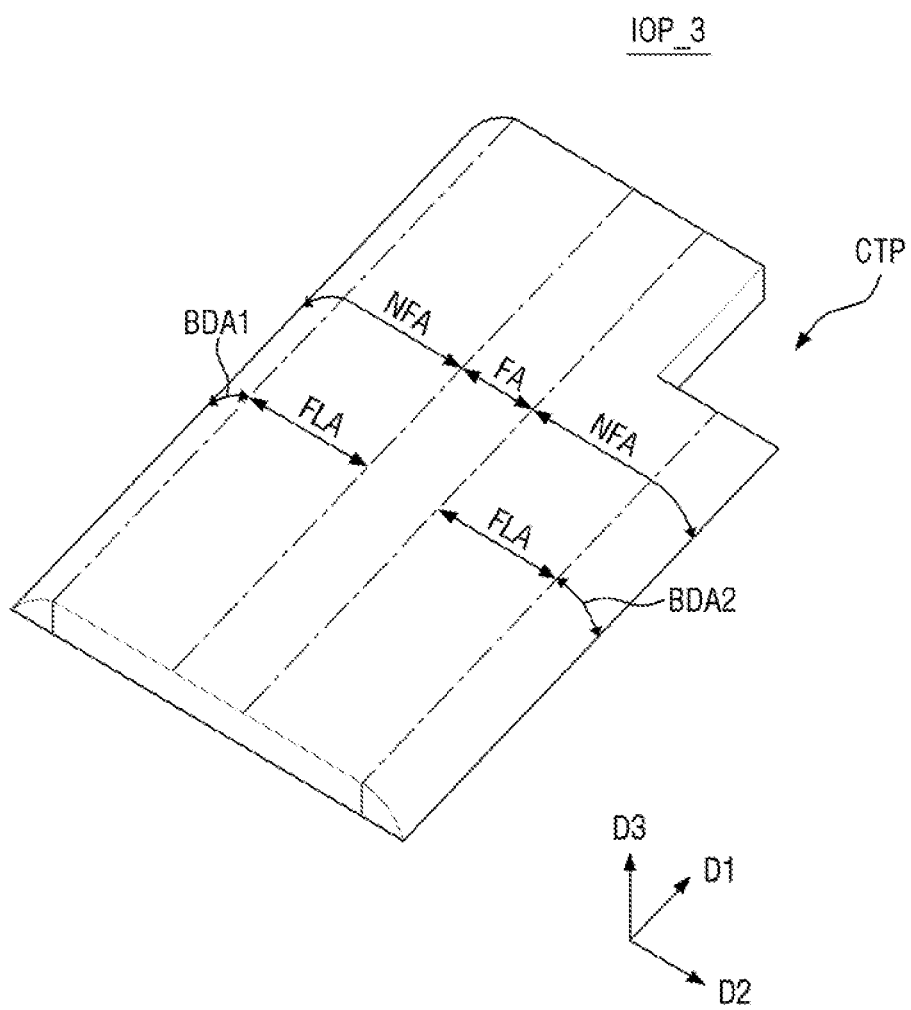
FIG. 44 is a schematic perspective view illustrating an inspection target panel according to an exemplary embodiment of the present disclosure.
Figure 45:
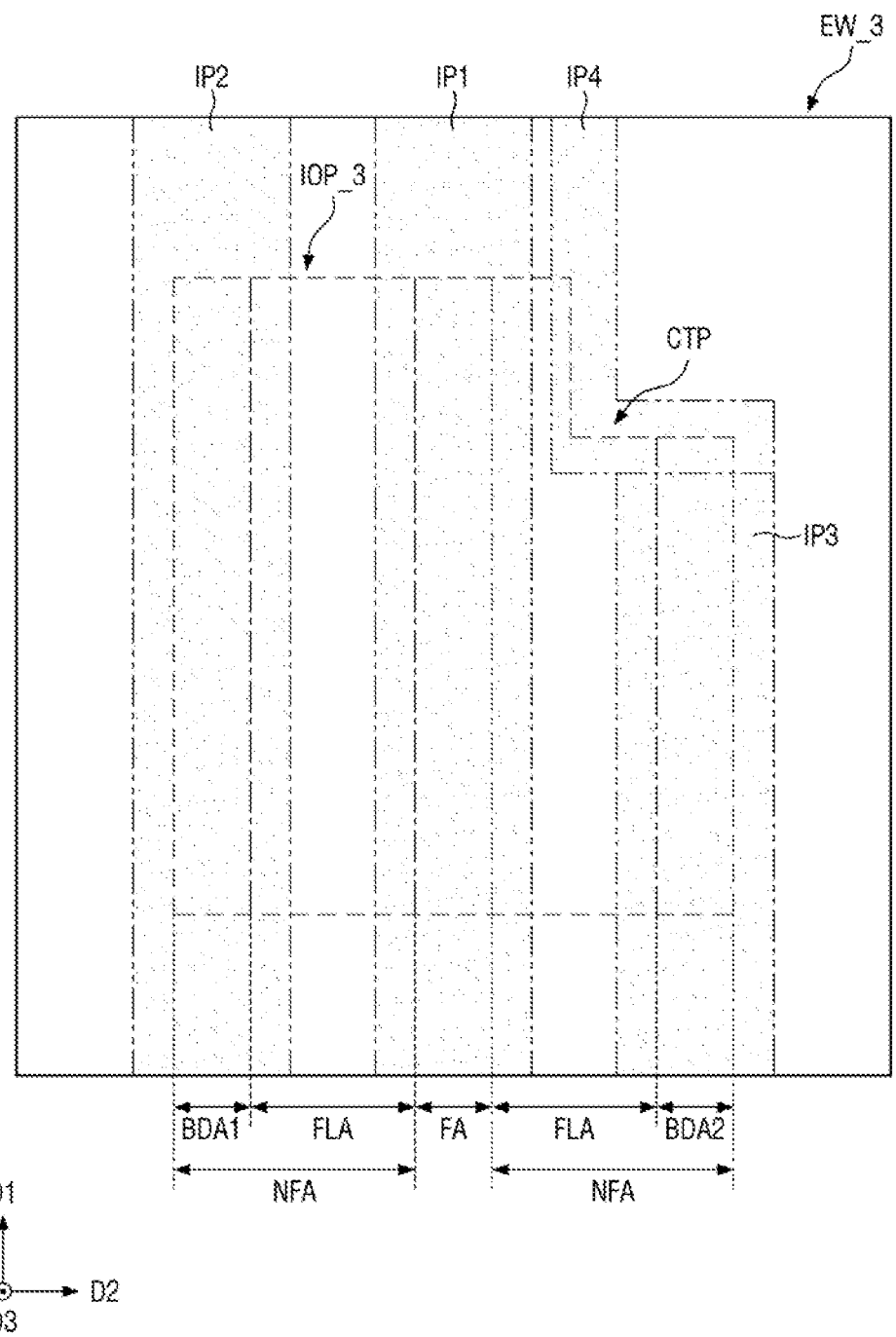
FIG. 45 is a schematic plan view illustrating an operation of inspecting the inspection target panel of FIG. 44 for the presence of adhesion defects by using an inspection window in an adhesion defect detection method using an adhesion defect detection apparatus according to an exemplary embodiment of the present disclosure.

FIG. 44 is a schematic perspective view illustrating an inspection target panel IOP_3 according to an exemplary embodiment of the present disclosure. FIG. 45 is a schematic plan view illustrating an operation of inspecting the inspection target panel IOP_3 of FIG. 44 for adhesion defects by using an inspection window in an adhesion defect detection method using an adhesion defect detection apparatus according to an exemplary embodiment of the present disclosure.

Referring to FIGS. 44 and 45, the inspection target panel IOP_3 may include a folding area FA, a non-folding area NFA and a cut area CTP, and the non-folding area NFA may include a flat part FLA and a first curved part BDA1 and a second curved part BDA2 disposed on both sides of the flat part FLA.

On a lower surface of an inspection window EW3, a first inspection adhesive IP1 is disposed to correspond to the folding area FA of the inspection target panel IOP_3, a second inspection adhesive IP2 is disposed to correspond to the first curved part BDA1 of the inspection target panel IOP_3, a third inspection adhesive IP3 is disposed to correspond to the second curved part BDA2 of the inspection target panel IOP_3, and a fourth inspection adhesive IP4 is disposed to correspond to the cut area CTP of the inspection target panel IOP_3. An area of the inspection window EW_3 on which the first inspection adhesive IP1 is disposed is changed in shape in the third direction D3, areas of the inspection window EW_3 on which the second inspection adhesive IP2, the third inspection adhesive IP3 and the fourth inspection adhesive IP4 are disposed are changed in shape in the direction opposite to the third direction D3, and these areas are brought close to the inspection target panel IOP_3 to detect adhesion defects such as weak adhesion portions in advance of bonding.

As described above, when the inspection target panel IOP_3 has folding characteristics and various shapes such as curved parts and a cut area, weak portions may be created when the inspection target panel IOP_3 is bonded to a cover window. Therefore, adhesion defects in the weak adhesion portions may be detected in advance of bonding. Accordingly, it is possible to prevent a situation where both the inspection target panel IOP_3 and the cover window are discharged because defects are detected after the inspection target panel IOP and the cover window are bonded together.

According to embodiments, it is possible to detect, in advance of bonding, defects that occur when a cover window and a display panel are bonded together. Therefore, a defect rate of a display device can be significantly reduced.

However, the effects of the present invention is not restricted to the one set forth herein. The above and other effects of the embodiments will become more apparent to one of ordinary skill in the art to which the embodiments pertain by referencing the claims.

What is claimed is:

1. An adhesion defect detection apparatus, comprising:
an inspection window comprising a first dummy area, a second dummy area, and an inspection area disposed between the first dummy area and the second dummy area;
a first shape changer disposed on the inspection window, the first shape changer being configured to change a shape of the inspection window in a first direction; and
a second shape changer disposed outside of both the first dummy area and the second dummy area, the second shape changer configured to change a shape of the inspection window in a second direction that is perpendicular to the first direction.

2. The apparatus of claim 1, further comprising:
an inspection target panel disposed under the inspection window; and
a third shape changer disposed outside of the inspection target panel, the third shape changer being configured to change the shape of the inspection target panel in the second direction.

3. The apparatus of claim 2, wherein the inspection target panel comprises a folding area and a non-folding area, and the inspection area at least partially overlaps the folding area in a thickness direction.

4. The apparatus of claim 3, further comprising an inspection adhesive which is disposed between the inspection area and the folding area, wherein the inspection adhesive contacts the inspection window and is spaced apart from the inspection target panel in the first direction.

5. The apparatus of claim 4, wherein a distance between the inspection adhesive and the inspection target panel is within a range of from 100 μm to 300 μm.

6. The apparatus of claim 4, wherein the first shape changer comprises a plurality of holes which are configured to suck in and expel air and change a shape of the inspection area in the first direction.

7. The apparatus of claim 2, wherein the inspection target panel comprises a flat part and a first curved part and a second curved part disposed at both ends of the flat part, and the inspection area comprises a first inspection area at least partially overlapping the first curved part in the thickness direction and a second inspection area at least partially overlapping the second curved part in the thickness direction, wherein the first inspection area and the second inspection area are spaced apart from each other.

8. The apparatus of claim 7, comprising a first inspection adhesive disposed between the first inspection area and the first curved part and a second inspection adhesive disposed between the second inspection area and the second curved part, wherein the first inspection adhesive and the second inspection adhesive each contact the inspection window and are spaced apart from the inspection target panel.

9. The apparatus of claim 8, wherein the first shape changer changes the shape of the first inspection area and the shape of the second inspection area in a third direction that is opposite to the first direction.

10. The apparatus of claim 9, wherein the first inspection adhesive and the second inspection adhesive are spaced apart from the first curved part and the second curved part along a morphology of the first curved part and the second curved part.

11. The apparatus of claim 2, wherein the inspection target panel comprises a folding area and a non-folding area, wherein the non-folding area comprises a flat part, a first curved part, and a second curved part, the first and second curved parts being disposed at opposite ends of the flat part, and the inspection area comprises a first inspection area at least partially overlapping the folding area in the thickness direction, a second inspection area at least partially overlapping the first curved part in the thickness direction, and a third inspection area at least partially overlapping the second curved part in the thickness direction, wherein the first inspection area, the second inspection area, and the third inspection area are spaced apart from each other.

12. The apparatus of claim 11, further comprising a first inspection adhesive disposed between the first inspection area and the folding area, a second inspection adhesive disposed between the second inspection area and the first curved part, and a third inspection adhesive disposed between the third inspection area and the second curved part, wherein the first inspection adhesive, the second inspection adhesive and the third inspection adhesive each contact the inspection window and are spaced apart from the inspection target panel in the first direction.

13. The apparatus of claim 12, wherein the first shape changer is configured to: change the shape of the first inspection area in the first direction, to change the shape of the second inspection area in a third direction, and to change the shape of the third inspection area in the third direction.

14. The apparatus of claim 13, wherein the second inspection adhesive and the third inspection adhesive are spaced apart from the first curved part and the second curved part, respectively, along a morphology of the first curved part and the second curved part.

15. A method for detecting adhesion defects, comprising:
straightening and/or stretching an inspection window and an inspection target panel;
bringing a first shape changer into contact with the inspection window and changing a shape of the inspection window in a first direction using the first shape changer; and
bringing the inspection window close to the inspection target panel to detect adhesion defects therein.

16. The method of claim 15, wherein the straightening and/or stretching of the inspection window and the inspection target panel comprises:
fixing the inspection window to a second shape changer and changing a shape of the inspection window in a second direction that is perpendicular to the first direction; and
fixing the inspection target panel to a third shape changer and changing the shape of the inspection target panel in the second direction.

17. The method of claim 16, wherein the inspection window comprises a first dummy area, a second dummy area, and an inspection area that is disposed between the first dummy area and the second dummy area, and the straightening and/or stretching of the inspection window and the inspection target panel further comprises forming an inspection adhesive on a lower surface of the inspection window to correspond to the inspection area.

18. The method of claim 17, wherein the second shape changer fixes a position of the first dummy area and the second dummy area and changes the shape of the inspection window in the second direction.

19. The method of claim 18, wherein the changing of the shape of the inspection window in the first direction using the first shape changer further comprises applying a positive or negative air pressure on the inspection window through a plurality of holes included in the first shape changer.

20. The method of claim 19, wherein the inspection target panel comprises a flat part and a first curved part and a second curved part disposed at opposite ends of the flat part, and the inspection area comprises a first inspection area at least partially overlapping the first curved part in a thickness direction and a second inspection area at least partially overlapping the second curved part in the thickness direction, wherein the first inspection area and the second inspection area are spaced apart from each other in the second direction.

21. The method of claim 20, comprising a first inspection adhesive disposed between the first inspection area and the first curved part and a second inspection adhesive disposed between the second inspection area and the second curved part, wherein the first inspection adhesive and the second inspection adhesive each contact the inspection window and are spaced apart from the inspection target panel in the first direction.

22. The method of claim 21, wherein the first shape changer changes the shape of the first inspection area in a third direction and changes the shape of the second inspection area in the third direction.

23. The method of claim 22, wherein the first inspection adhesive and the second inspection adhesive are spaced apart from the first curved part and the second curved part along a morphology of the first curved part and the second curved part.

24. The method of claim 19, wherein the inspection target panel comprises a folding area and a non-folding area, and the inspection area, the inspection adhesive, and the folding area at least partially overlap each other in the thickness direction.

25. The method of claim 24, wherein the non-folding area comprises a flat part and a first curved part and a second curved part disposed at both ends of the flat part, and the inspection area comprises a first inspection area at least partially overlapping the folding area in the thickness direction, a second inspection area at least partially overlapping the first curved part in the thickness direction and a third inspection area at least partially overlapping the second curved part in the thickness direction, wherein the first inspection area, the second inspection area and the third inspection area are spaced apart from each other in the second direction.

26. The method of claim 25, comprising a first inspection adhesive disposed between the first inspection area and the folding area, a second inspection adhesive disposed between the second inspection area and the first curved part and a third inspection adhesive disposed between the third inspection area and the second curved part, wherein the first inspection adhesive, the second inspection adhesive and the third inspection adhesive each contact the inspection window and are spaced apart from the inspection target panel in the first direction.

27. The method of claim 26, wherein the first shape changer changes the shape of the first inspection area in the first direction, changes the shape of the second inspection area in a third direction, and changes the shape of the third inspection area in the third direction.

28. The method of claim 27, wherein the second inspection adhesive and the third inspection adhesive are spaced apart from the first curved part and the second curved part along a morphology of the first curved part and the second curved part.

29. The method of claim 28, wherein the bringing of the inspection window close to the inspection target panel to detect the adhesion defects further comprises detecting adhesion defects by bending the inspection window and the inspection target panel in a state where the inspection window is brought close to the inspection target panel.

* * * * *